United States Patent
Yamashita et al.

(10) Patent No.: US 8,318,548 B2
(45) Date of Patent: Nov. 27, 2012

(54) METHOD FOR MANUFACTURING SEMICONDUCTOR DEVICE

(75) Inventors: Kunihiro Yamashita, Kanagawa (JP); Kazushi Hatauchi, Kanagawa (JP); Tetsuya Uebayashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 74 days.

(21) Appl. No.: 12/853,841

(22) Filed: Aug. 10, 2010

(65) Prior Publication Data

US 2011/0039376 A1   Feb. 17, 2011

(30) Foreign Application Priority Data

Aug. 11, 2009   (JP) ................................. 2009-186701

(51) Int. Cl.
*H01L 21/00* (2006.01)
(52) U.S. Cl. ........................................ 438/123; 438/111
(58) Field of Classification Search .................. 438/111, 438/123; 257/666, 672, 676, E33.066, E23.031, 257/E23.043, E23.052, E23.141
See application file for complete search history.

(56) References Cited

U.S. PATENT DOCUMENTS

| 2001/0011668 A1* | 8/2001 | Gotoh et al. | 228/1.1 |
| 2009/0061563 A1* | 3/2009 | Ito et al. | 438/111 |

FOREIGN PATENT DOCUMENTS

| JP | 2001-303222 | 10/2005 |
| JP | 2005-327967 | 11/2005 |

* cited by examiner

*Primary Examiner* — Charles Garber
*Assistant Examiner* — Calvin Choi
(74) *Attorney, Agent, or Firm* — McDermott Will & Emery LLP

(57) ABSTRACT

A high positional accuracy of a semiconductor chip is attained to stabilize the quality of a semiconductor device. In a die bonding process during assembly of an SIP, a microcomputer chip not required to have a high positional accuracy is picked up with a surface non-contact type collet and is die-bonded onto a first chip mounting portion, thereafter, an ASIC chip required to have a high positional accuracy is picked up with a surface contact type collet and die-bonded onto a second chip mounting portion. By thus using two types of collets properly, not only a high positional accuracy of the ASIC chip which has been die-bonded with the surface contact type collet is attained, but also the quality of the SIP is stabilized.

12 Claims, 20 Drawing Sheets

METHOD FOR MANUFACTURING SEMICONDUCTOR DEVICE

CROSS-REFERENCE TO RELATED APPLICATIONS

The disclosure of Japanese Patent Application No. 2009-186701 filed on Aug. 11, 2009 including the specification, drawings and abstract is incorporated herein by reference in its entirety.

BACKGROUND OF THE INVENTION

The present invention relates to a semiconductor device manufacturing technique and more particularly to a technique applicable effectively to stabilizing the quality of a semiconductor device having a plurality of semiconductor chips.

As a semiconductor device having a plurality of semiconductor chips, for example in Japanese Unexamined Patent Publication No. 2005-303222 (Patent Document 1) there is described a structure in which a microcomputer chip and a SDRAM are arranged side by side. Further, in Japanese Unexamined Patent Publication No. 2005-327967 (Patent Document 2) is described a structure having a first chip and a second chip bonded horizontally to die pads respectively and further having wires, the wires being bonded at one ends thereof to an upper surface of the first chip and at opposite ends thereof to upper surfaces of leads after jumping over the second chip.

SUMMARY OF THE INVENTION

Recently there has been developed a semiconductor device called SIP (System In Package) with a plurality of semiconductor chips (hereinafter also referred to as chips) mounted within one package. There are various types of SIPs. In one type, a plurality of semiconductor chips are stacked, and in another type, semiconductor chips are arranged horizontally on one and same plane.

Accordingly, the wiring design has also become complicated and the position of die bonding to a die pad (also called a chip mounting portion or a tab) of a lead frame has also been required to have a high accuracy. There is a semiconductor device including both a semiconductor chip for which a high positional accuracy is required and a semiconductor chip for which a high positional accuracy is not required.

In a die bonding process during assembly of a semiconductor device, a semiconductor chip is chucked and picked up with use of a jig called collet and is mounted onto a die pad of a lead frame through a resinous or solder paste as an adhesive.

A description will be given below about the type and characteristics of collets for picking up semiconductor chips.

Chip pick-up collets employable in the semiconductor manufacturing process are broadly classified into a surface contact type and a surface non-contact type. The surface contact type collet comes into contact with a circuit-formed surface or a back surface of a semiconductor chip, then chucks the surface and picks up the chip. Therefore, when chucking the circuit-formed surface, it is sometimes required to give consideration to protection of the circuit-formed surface.

On the other hand, the surface non-contact type collet does not contact the circuit-formed surface of the semiconductor chip, but comes into contact with marginal portions (edge portions) located outside the circuit-formed surface, then in this state chucks and picks up the chip.

With the surface contact type collet, since one surface of the semiconductor chip is chucked, it is possible to chuck the semiconductor chip with a large chucking force and hence possible to ensure a high positional accuracy of the semiconductor chip. However, in case of chucking the circuit-formed surface as described above, there sometimes occurs a case where protection of the circuit-formed surface is required.

On the other hand, with the surface non-contact type collet, as noted above, any special protection for the circuit-formed surface is not needed because the collet chucks the semiconductor chip in contact with edge portions of the chip surface. However, since the surface is not chucked directly, the semiconductor chucking force is weak in comparison with the surface contact type collet and it is difficult to ensure a high positional accuracy.

In connection with SIP, the inventors in the present case have made a study about assembling the structure including both a semiconductor chip for which a high positional accuracy is required and a semiconductor chip for which a high positional accuracy is not required. As a result, we found out the following problems.

First, in connection with an SIP including both a semiconductor chip required to meet a high positional accuracy requirement and a semiconductor chip not required to meet a high positional accuracy requirement, if an attempt is made to use only one type of collet for picking up both types of semiconductor chips, there arises the problem that it is difficult to make both ensuring a positional accuracy of each chip and protection of the circuit-formed surface of each chip compatible with each other.

If the picking-up operation is performed dividedly for both types of semiconductor chips with use of two types of collets, there arises the problem that not only the productivity is deteriorated but also the manufacturing cost increases.

In each of Patent Document 1 (Japanese Unexamined Patent Publication No. 2005-303222) and Patent Document 2 (Japanese Unexamined Patent Publication No. 2005-327967) there is described a package structure including two types of semiconductor chips. However, in neither of the patent documents there is found any description about a collet to be used in the process of picking up the two types of semiconductor chips.

The present invention has been accomplished in view of the above-mentioned problems and it is an object of the invention to provide a technique able to attain a high positional accuracy of a semiconductor chip and thereby stabilize the quality of the semiconductor device concerned.

It is another object of the present invention to provide a technique able to improve the productivity while keeping cost-up of a semiconductor device to a minimum.

It is a further object of the present invention to provide a technique able to improve the yield in the manufacture of a semiconductor device.

The above and other objects and novel features of the present invention will become apparent from the following description and the accompanying drawings.

Of the inventions disclosed herein, typical ones will be outlined below.

In one aspect of the present invention there is provided a method for manufacturing a semiconductor device, comprising the steps of (a) providing a lead frame, the lead frame having a chip mounting portion and a plurality of leads arranged around the chip mounting portion, the chip mounting portion including a first chip mounting portion and a second chip mounting portion disposed side by side with the first chip mounting portion, (b) picking up a first semiconductor chip with a surface non-contact type collet and die-bonding the picked-up first semiconductor chip over the first chip mounting portion, (c) after the step (b), picking up a second semiconductor chip with a surface contact type collet and die-bonding the picked-up second semiconductor chip over the second chip mounting portion, and (d) after the step (c), wire-bonding each of the first and second semiconductor chips.

In another aspect of the present invention there is provided a method for manufacturing a semiconductor device, comprising the steps of (a) providing a wiring substrate, the wiring substrate having a chip mounting portion and a plurality of bonding leads arranged around the chip mounting portion, the chip mounting portion including a first chip mounting portion and a second chip mounting portion disposed side by side with the first chip mounting portion, (b) picking up a first semiconductor chip with a surface non-contact type collet and die-bonding the picked-up first semiconductor chip over the first chip mounting portion, (c) after the step (b), picking up a second semiconductor chip with a surface contact type collet and die-bonding the picked-up second semiconductor chip over the second chip mounting portion, and (d) after the step (c), wire-bonding each of the first and second semiconductor chips.

The following is a brief description of effects obtained by typical inventions out of the inventions disclosed herein.

By using two types of collets properly in the die bonding process during assembly of an SIP, not only a high positional accuracy of each semiconductor chip is attained, but also it is possible to stabilize the quality of the semiconductor device. Moreover, it is possible to improve the productivity while keeping cost-up of the semiconductor device to a minimum. Further, not only the yield in the manufacture of the semiconductor device can be improved, but also it is possible to maintain a high quality of the semiconductor device.

DETAILED DESCRIPTION OF THE PREFERRED EMBODIMENTS

Figure 1:
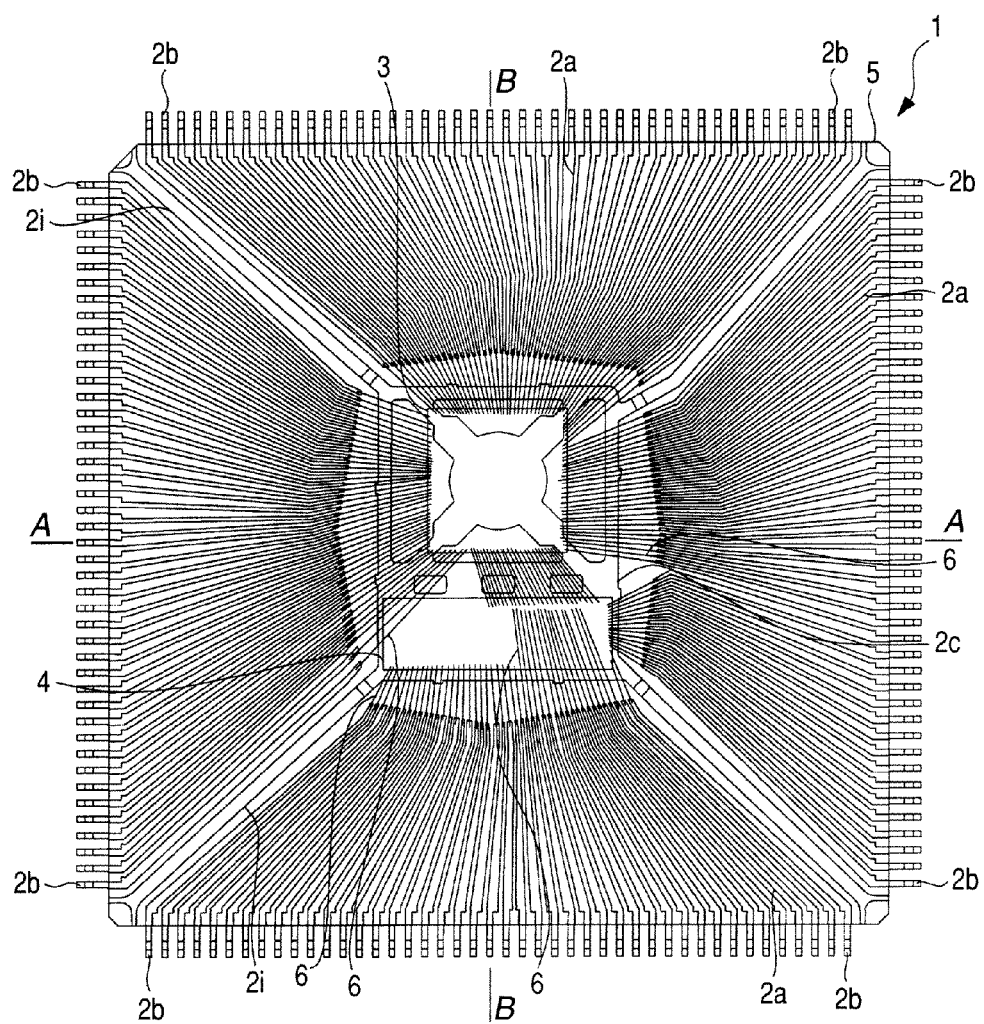
FIG. 1 is a plan view showing through a sealing body a structural example of a semiconductor device according to an embodiment of the present invention.

In the following embodiments, explanations of the same or similar portions will not be repeated in principle except when such explanations are specially needed.

The following embodiments will each be described dividedly into plural sections or embodiments where required for the sake of convenience, but unless otherwise specified, it is to be understood that they are not unrelated to each other, but one is in a relation of modification or detailed or supplementary explanation of part or the whole of the other.

When reference is made to, for example, the number of elements (including the number of pieces, numerical value, quantity, and range) in the following embodiments, no limitation is made to the specified number, but numbers above and below the specified number will do unless otherwise specified and except the case where limitation is made to the specified number basically clearly.

In the following embodiments, moreover, it goes without saying that their constituent elements (including constituent steps) are not always essential unless otherwise specified and except the case where they are considered essential basically clearly.

In the following embodiments, when the expressions "comprise A," "comprised of A," "have A," and "include A," are used with respect to constituent elements, etc., it goes without saying that other elements are not excluded except the case where specifying is made to the effect of making limitation to that element alone. Likewise, in the following embodiments, it is to be understood that when reference is made to the shape and positional relation of a constituent element, those substantially similar or closely similar thereto are also included unless otherwise specified and except the case where the answer is negative basically clearly. This is also true of the foregoing numerical value and range.

Embodiments of the present invention will be described below in detail with reference to the drawings. In all of the drawings for illustrating the embodiments, members having the same functions are identified by the same reference numerals, and repeated explanations thereof will be omitted.

Embodiment

Figure 2:
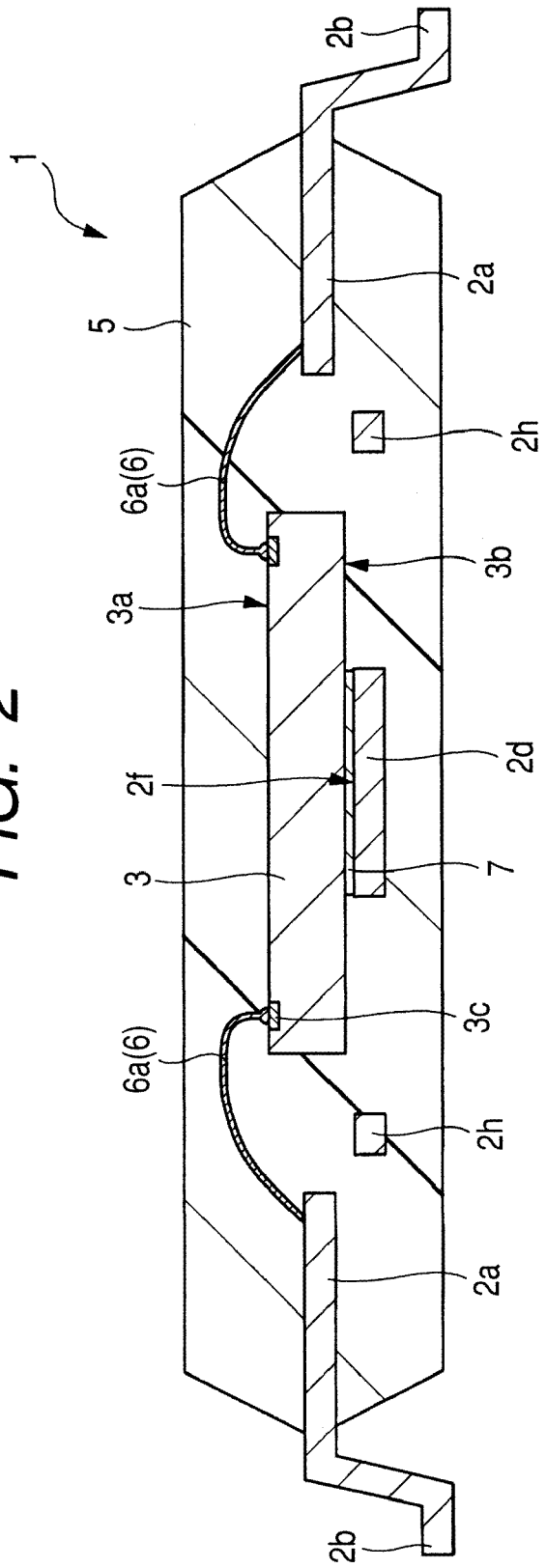
FIG. 2 is a sectional view taken along line A-A in FIG. 1.
Figure 3:
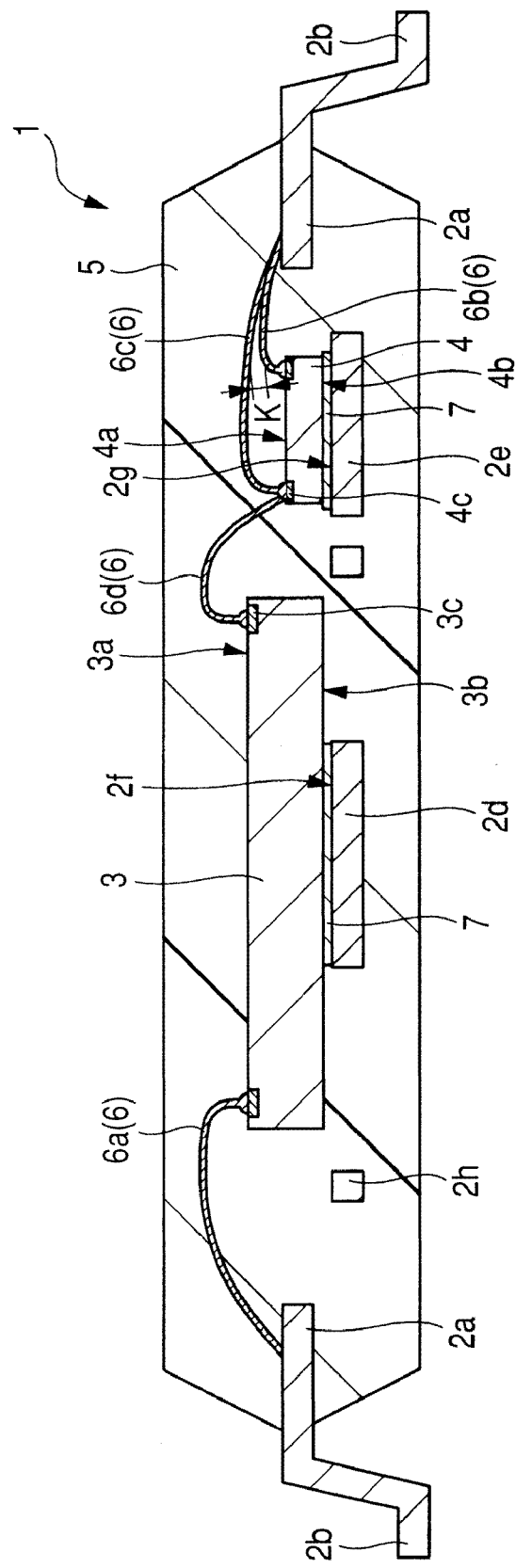
FIG. 3 is a sectional view taken along line B-B in FIG. 1.
Figure 4:
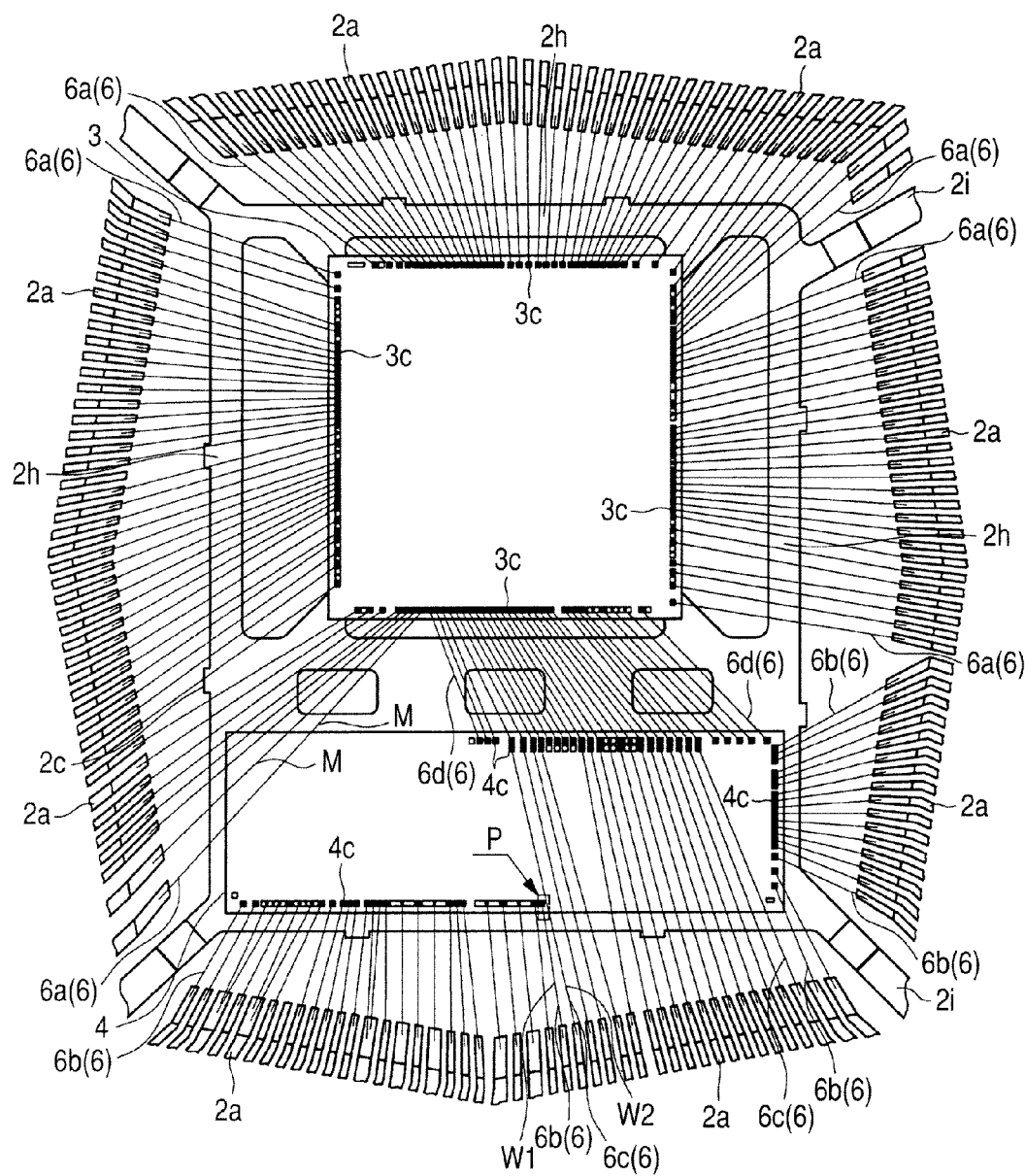
FIG. 4 is a partial plan view showing an example of a wiring state in the semiconductor device of FIG. 1.
Figure 5:
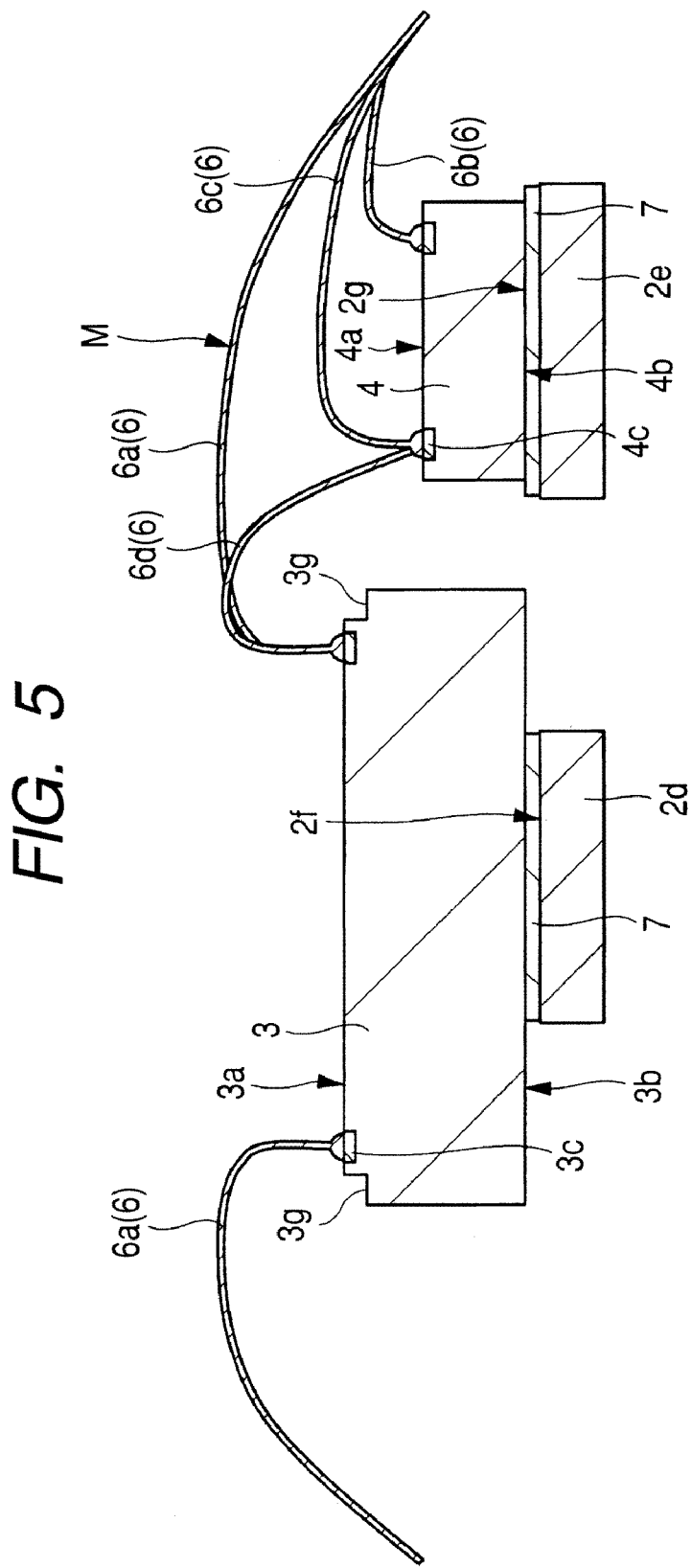
FIG. 5 is a sectional view showing an example of an appearance and structure of a first semiconductor chip and that of a second semiconductor chip both mounted on the semiconductor device of FIG. 1.
Figure 6:
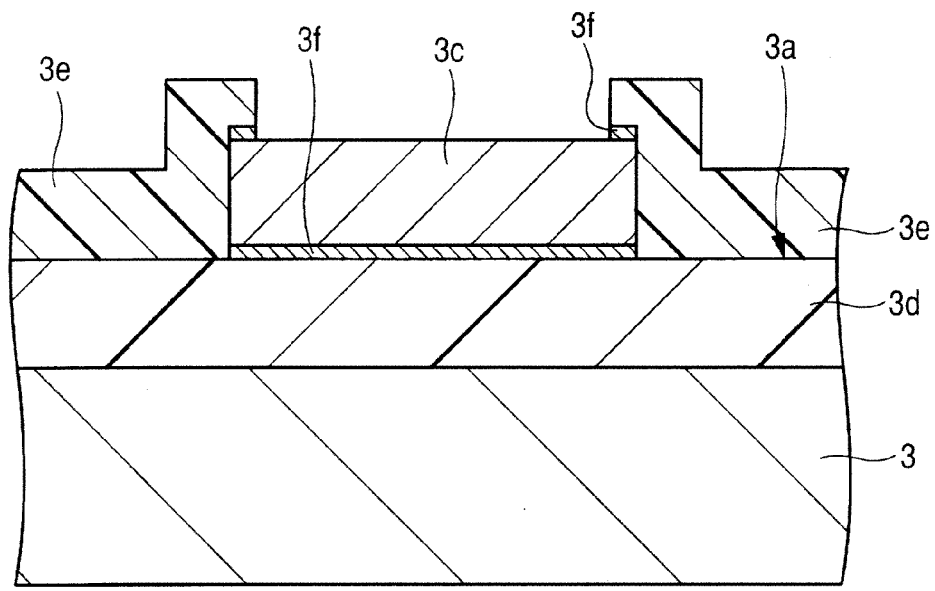
FIG. 6 is an enlarged partial sectional view showing a structural example around an electrode pad formed on the first semiconductor chip shown in FIG. 5.
Figure 7:
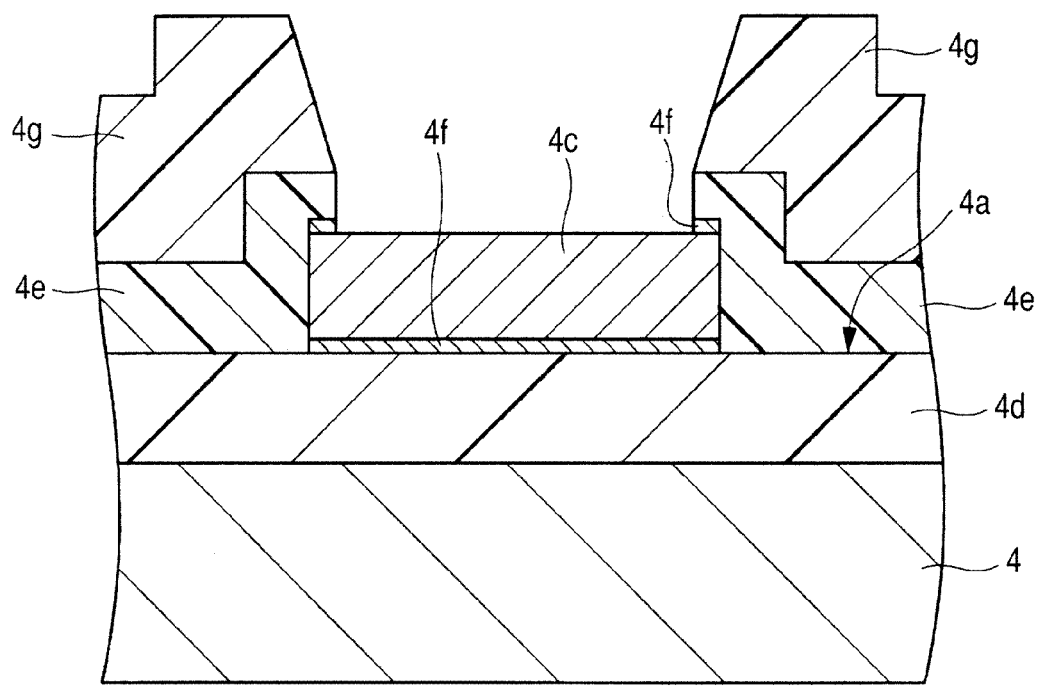
FIG. 7 is an enlarged partial sectional view showing a structural example around an electrode pad formed on the second semiconductor chip shown in FIG. 5.

FIG. 1 is a plan view showing through a sealing body a structural example of a semiconductor device according to an embodiment of the present invention, FIG. 2 is a sectional view taken along line A-A in FIG. 1, FIG. 3 is a sectional view taken along line B-B in FIG. 1, and FIG. 4 is a partial plan view showing an example of a wiring state in the semiconductor device of FIG. 1. Further, FIG. 5 is a sectional view showing an example of an appearance and structure of a first semiconductor chip and that of a second semiconductor chip both mounted on the semiconductor device of FIG. 1, FIG. 6 is an enlarged partial sectional view showing a structural example around an electrode pad formed on the first semiconductor chip shown in FIG. 5, and FIG. 7 is an enlarged partial sectional view showing a structural example around an electrode pad formed on the second semiconductor chip shown in FIG. 5.

The semiconductor device of this embodiment is a multi-pin and resin-sealed type semiconductor device which is assembled using a lead frame. It is a semiconductor package having two semiconductor chips mounted side by side on die pads which are chip mounting portions (also called tabs). In this embodiment, reference will be made to such a QFP (Quad Flat Package) type SIP 1 as shown in FIGS. 1 to 3, as an example of the above semiconductor device.

A description will be given about the configuration of the SIP 1 shown in FIGS. 1 to 3. The SIP 1 includes a die pad 2c, the die pad 2c having a first die pad 2d as a first chip mounting portion and a second die pad 2e as a second chip mounting portion, a microcomputer chip 3 as a first semiconductor chip mounted on the first die pad 2d, an ASIC (Application Specific Integrated Circuit) chip 4 as a second semiconductor chip mounted on the second die pad 2e, a plurality of inner leads (leads) 2a arranged radially around the microcomputer chip 3 and the ASIC chip 4, and a plurality of outer leads 2b integral with the inner leads 2a respectively.

The microcomputer chip 3 has a main surface 3a which is a circuit-formed surface with a semiconductor integrated circuit as a control circuit formed thereon and a back surface 3b located on the side opposite to the main surface 3a. A plurality of electrode pads 3c as surface electrodes are formed along marginal portions of the main surface 3a. On the other hand, the ASIC chip 4 has a main surface 4a which is a circuit-formed surface with an analog logic circuit formed thereon and a back surface 4b located on the side opposite to the main surface 4a. A plurality of electrode pads 4c as surface pads are formed along marginal portions of the main surface 4a.

The SIP 1 includes a plurality of wires 6 for coupling the electrode pads 3c of the microcomputer chip 3 or the electrode pads 4c of the ASIC chip 4 electrically with corresponding inner leads 2a and further includes a sealing body 5, the sealing body 5 being formed of resin, for example, by resin molding to seal all of the microcomputer chip 3, ASIC chip 4, wires 6 and inner leads 2a with the resin.

In the die pad 2c, an upper surface 2f of the first die pad 2d and an upper surface 2g of the second die pad 2e are flush with each other. The microcomputer chip 3 is bonded to the upper surface 2f of the first die pad 2d through a paste material 7 as a die bonding material. On the other hand, the ASIC chip 4 is bonded to the upper surface 2g of the second die pad 2e likewise through the paste material 7 as a die bonding material. That is, the back surface 3b of the microcomputer chip 3 is bonded to the upper surface 2f of the first die pad 2d through the paste material 7. Further, the back surface 4b of the ASIC chip 4 is bonded to the upper surface 2g of the second die pad 2e through the paste material 7. Thus, the microcomputer chip 3 and the ASIC chip 4 are mounted horizontally side by side on the same plane of the same height of the die pad 2c.

The die pad 2c comprising the first die pad 2d and the second die pad 2e is coupled at four corners thereof to suspending leads 2i and is supported thereby.

Figure 9:
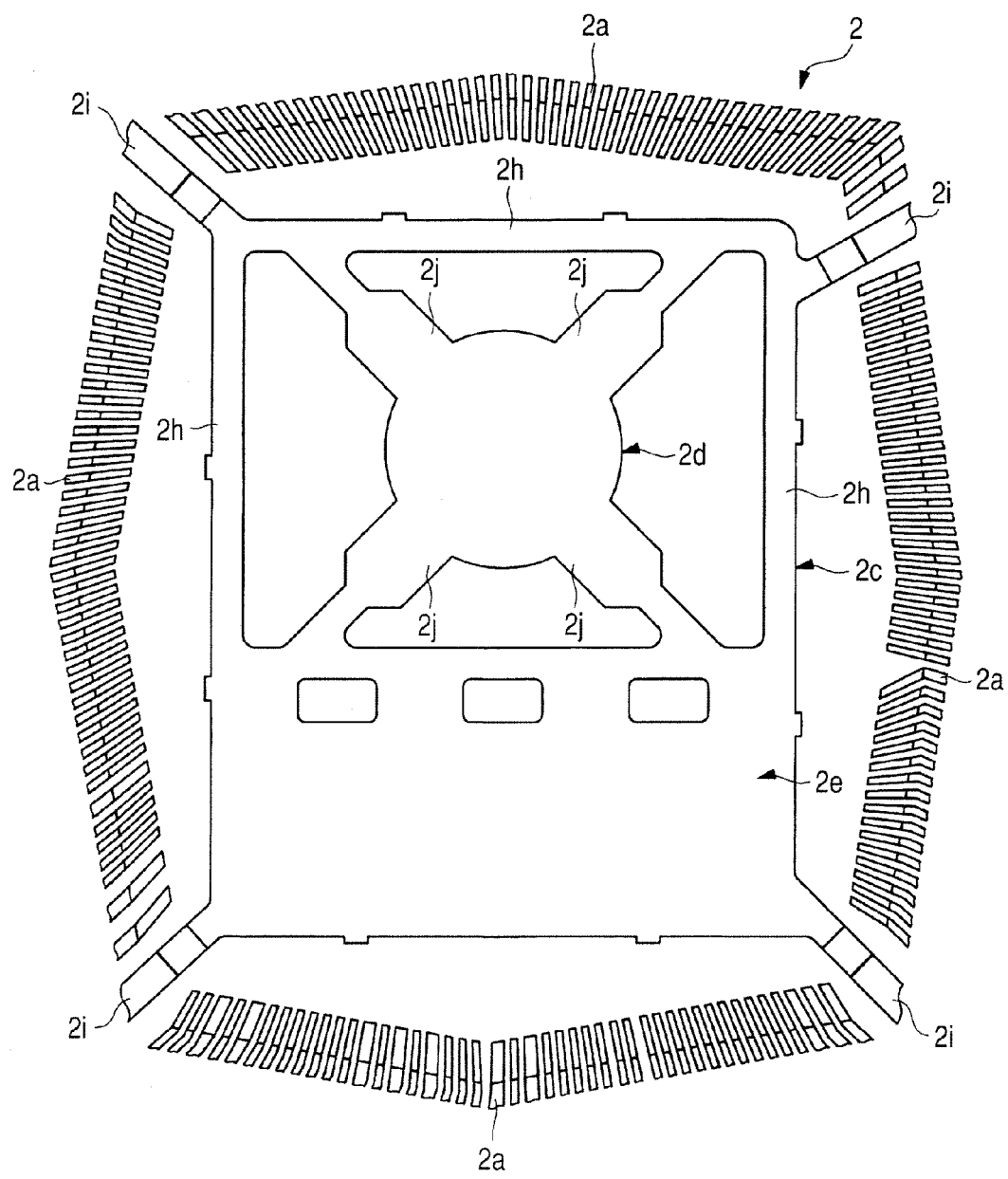
FIG. 9 is a partial plan view showing a structural example of die pads and the environs thereof of a lead frame used in assembling the semiconductor device of FIG. 1.

In the die pad 2c, as shown in FIG. 9, the first die pad 2d is in the shape of a small circle, which is smaller than the back surface 3b of the microcomputer chip 3. That is, the first die pad 2d has a small tab structure. The circular first die pad 2d is supported by supporting leads 2j at four positions, the supporting leads 2j being coupled to frame portions 2h of the die pad 2c.

Since the first die pad 2d has thus a small tab structure, it is possible to increase the area of bonding between the sealing body 5 (sealing resin) and the back surface 3b of the microcomputer chip 3 and thereby suppress cracking (package cracking) of the sealing body 5.

Since the SIP 1 of this embodiment is the QFP type, the outer leads 2b formed integrally with the inner leads 2a respectively project outwards from the four sides of the sealing body 5, each outer lead 2b being bent in a gull wing shape.

The microcomputer chip 3 and the ASIC chip 4 are semiconductor chips each formed by a silicon substrate for example. The die pad 2c, suspending leads 2i, inner leads 2a and outer leads 2b are each formed by a thin plate member of, for example, copper alloy or iron-nicked alloy. The sealing body 5 is formed of, for example, a thermosetting epoxy resin and it is formed by resin molding. The wires 6 for coupling electrode pads of the microcomputer chip 3 and ASIC chip 4 electrically with corresponding inner leads 2a are, for example, gold wires. Further, the paste material 7 for fixing the microcomputer chip 3 and the ASIC chip 4 to the die pad 2c is, for example, silver paste.

In the SIP 1 of this embodiment, as shown in FIG. 4, there exist three wiring patterns when classified broadly. The first wiring pattern includes first wires 6a for coupling the microcomputer chip 3 with the inner leads 2a, the second wiring pattern includes fourth wires 6d for coupling the microcomputer chip 3 with the ASIC chip 4, and the third wiring pattern includes wires 6 for coupling the ASIC chip 4 with the inner leads 2a. In the ASIC chip 4, the wires 6 for coupling the ASIC chip with the inner leads 2a are classified into second wires 6b which are for coupling electrode pads 4c disposed near a marginal portion of the die pad 2c with inner leads 2a electrically and third wires 6c which are for coupling electrode pads 4c disposed near the center of the die pad 2c with inner leads 2a electrically, in the ASIC chip 4.

Of these wiring patterns in the SIP 1, as indicated at portion P in FIG. 4, a second wire 6b (W1) for coupling an electrode pad 4c disposed near a marginal portion of the die pad 2c with an inner lead 2a electrically and a third wire 6c (W2) for coupling an electrode pad 4c disposed near the center of the die pad 2c with an inner lead 2a electrically, in the ASIC chip 4, are very close to each other. In this case, the third wire 6c (W2) is much longer than the second wire 6b (W1). Besides, as in FIG. 3 which shows a sectional structure of the portion P, the third wire 6c is larger in wire loop height than the second wire 6b. The difference (K) in wire loop height between the second and third wires 6b, 6c is, for example, about 80-odd to 90-odd μm. When sagging of the third wire 6c due to its large length is taken into account, the second wire 6b (W1) and the third wire 6c (W2) are in a very close positional relation to each other on the electrode pad 4c (on the portion P) near a marginal portion.

In the SIP 1, therefore, a very high positional accuracy is required in die bonding of the ASIC chip 4.

On the other hand, as to the microcomputer chip 3, its positional accuracy in die bonding is not required to be so high as in the case of the ASIC chip 4. Thus, the SIP 1 of this embodiment is a semiconductor package including both the ASIC chip (second semiconductor chip) 4 for which a high positional accuracy is required and the microcomputer chip (first semiconductor chip) 3 for which a high positional accuracy is not required.

In the SIP 1, two types of collets are used properly in the die bonding process during assembly of the SIP to meet the high positional accuracy requirement for the ASIC chip 4. The two types of collets are a surface contact type collet and a surface non-contact type collet.

More specifically, in the die bonding process, the microcomputer chip 3 not required to have a high positional accuracy is picked up using the surface non-contact type collet and is subjected to die bonding, while the ASIC chip 4 required to have a high positional accuracy is picked up using the surface contact type collet and is subjected to die bonding. As described earlier, the surface contact type collet can chuck the semiconductor chip with a large chucking force because it chucks the chip surface, thus making it possible to ensure a high positional accuracy of the semiconductor chip during die bonding.

On the other hand, with the surface non-contact type collet, since it chucks and holds the semiconductor chip in a state of contact with surface edge portions of the chip, its semiconductor chip chucking force is weaker than that of the surface contact type collet and it is difficult to ensure a high positional accuracy.

With such two types of collets, it becomes possible to effect die bonding of the ASIC chip 4 with a high positional accuracy.

Figure 12:
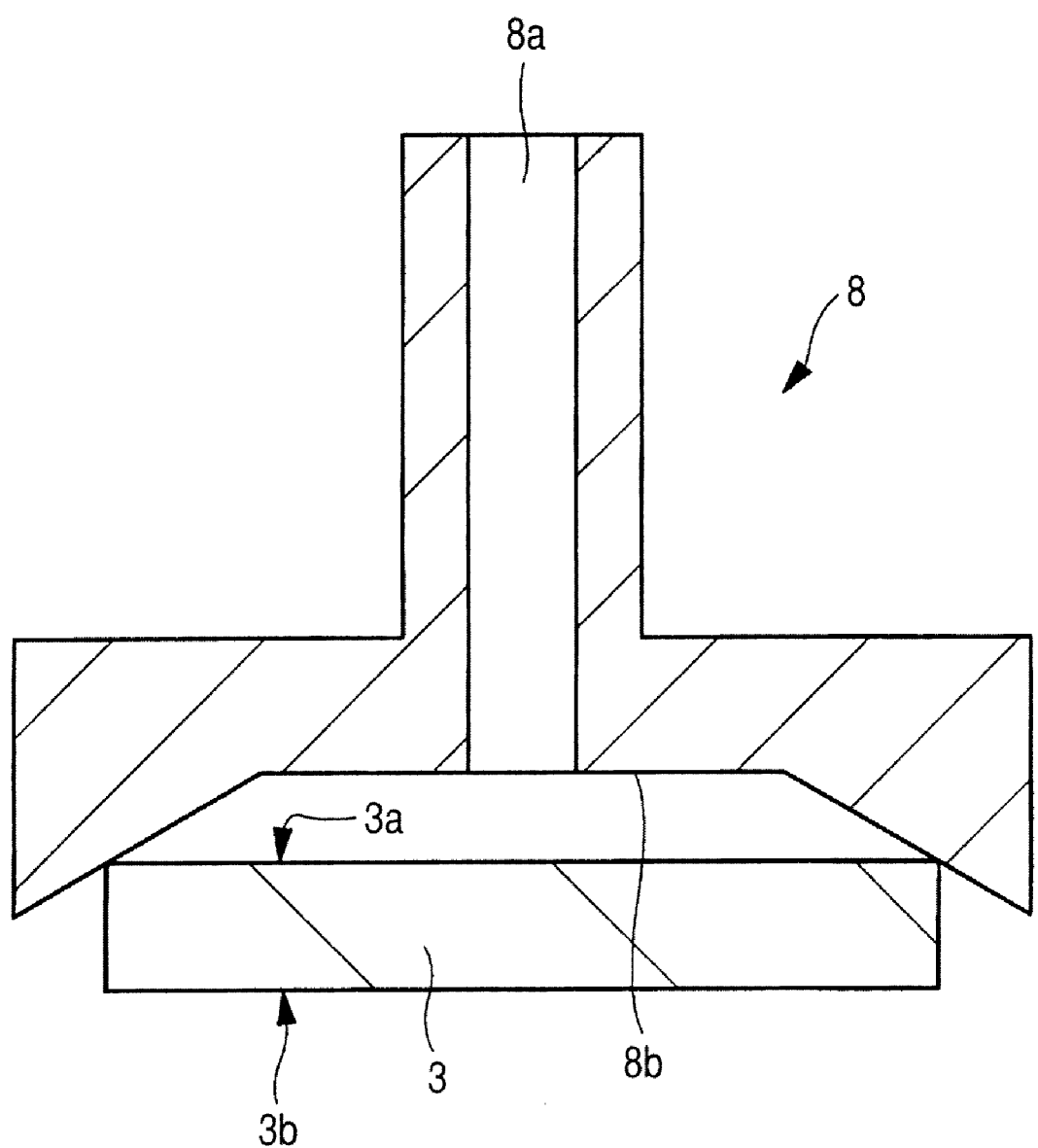
FIG. 12 is a sectional view showing a structural example in a chucking state of a pick-up collet used in the first die bonding process shown in FIG. 10.
Figure 13:
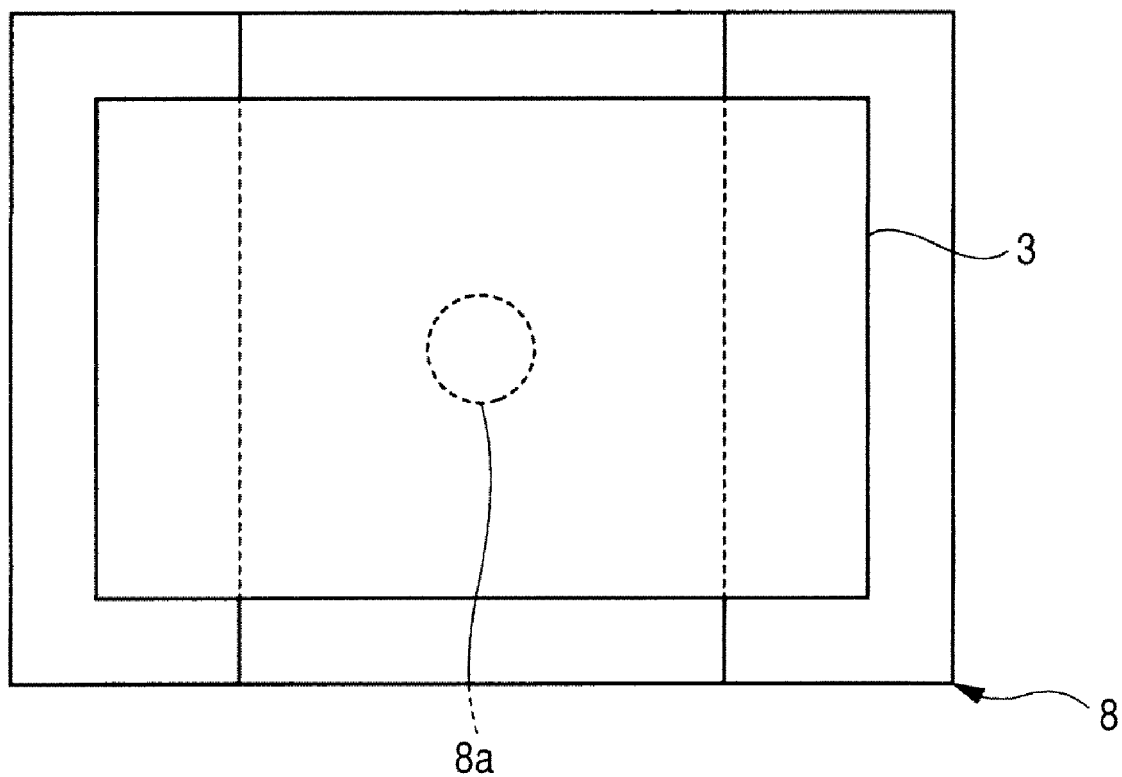
FIG. 13 is a back view thereof.
Figure 14:
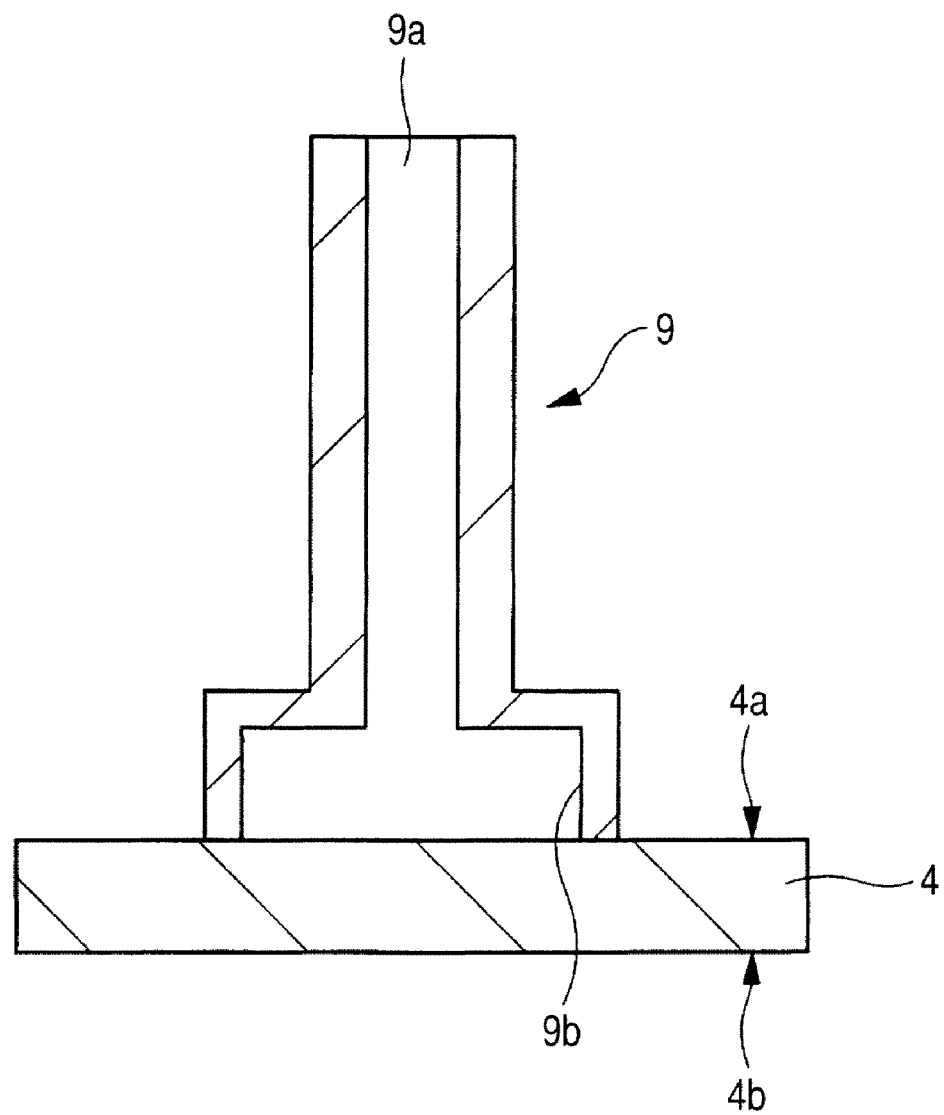
FIG. 14 is a sectional view showing a structural example in a chucking state of a pick-up collet used in the second die bonding process shown in FIG. 11.
Figure 15:
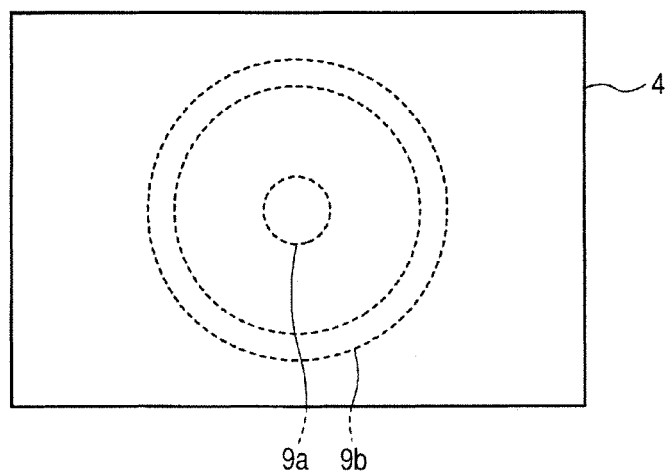
FIG. 15 is a back view thereof.

In this embodiment, reference is made to an example in which a clog-shaped collet 8 shown in FIGS. 12 and 13 is used as an example of the surface non-contact type collet and a round collet 9 shown in FIGS. 14 and 15 is used as an example of the surface contact type collet.

A description will be given first about the clog-shaped collet 8. For picking up a semiconductor chip (the semiconductor chip 3), as shown in FIG. 12, the clog-shaped collet 8 comes into contact with edge portions of the chip and in this state chucks and holds the chip by suction from a central suction hole 8a. That is, on the main surface of the quadrangular semiconductor chip, the clog-shaped collet 8 holds the semiconductor chip in such a manner that its slant faces come into contact with a set of opposed sides of the chip.

Therefore, not only a space is formed between the main surface 3a of the microcomputer chip 3 and a suction part 8b of the clog-shaped collet 8, but also air leaks at side portions of the suction part 8b of the clog-shaped collet 8, so that the sucking force becomes weak and it is impossible to attain a high positional accuracy during pick-up of the chip. In the SIP 1 of this embodiment, since the microcomputer chip 3 is not required to have a high positional accuracy, there arises no special problem even if the chip picking-up operation is performed with the clog-shaped collet 8.

In the case of the clog-shaped collet 8, since the collet does not come into contact with the main surface 3a as the circuit-formed surface of the microcomputer chip 3 except edge portions of the chip, it is possible to avoid damage to the main surface 3a of the microcomputer chip 3.

On the other hand, in the chip picking-up operation using the round collet 9, as shown in FIG. 14, the collet comes into contact with the circuit-formed surface (upper surface) of a semiconductor chip (the ASIC chip 4) and in this state chucks and holds the chip by suction from a central suction hole 9a. Thus, in the case of the round collet 9, a gap is difficult to be formed between a tip suction part 9b and the circuit-formed surface of the semiconductor chip, so that air is difficult to leak and the chucking force can be kept high. As a result, a high positional accuracy can be developed during pick-up of the chip.

Thus, in the SIP 1 of this embodiment, the ASIC chip 4 required to have a high positional accuracy is picked up using the surface contact type round collet 9 and is subjected to die bonding, whereby the ASIC chip 4 can be die-bonded with a high positional accuracy. In the ASIC chip 4, since the chip surface is chucked with the round collet 9, such a polyimide coating film 4g as shown in FIG. 7 is formed on the chip surface in order to diminish damage to the chip surface and thereafter the round collet 9 is used to ensure a high positional accuracy.

When the microcomputer chip 3 is picked up, as shown in FIG. 12, the suction part 8b of the clog-shaped collet 8 comes into contact with edge portions of the chip main surface 3a. In view of this point, stepped cut portions 3g as stepped concave portions are formed in edge portions of the main surface (circuit-formed surface) 3a, as shown in FIG. 5. Thus, since the concave stepped cut portions 3g are formed in edge portions of the main surface 3a of the microcomputer chip 3, it is possible to diminish contact of the edge portions with the suction part 8b of the clog-shaped collet 8. As a result, not only the amount of aluminum scrap produced from the microcomputer chip 3 can be decreased, but also it is possible to suppress a lowering in chucking force of the clog-shaped collet 8 caused by generation of dust particles.

On the other hand, when the ASIC chip 4 is picked up, as shown in FIG. 14, since the suction part 9b of the round collet 9 comes into contact with the chip main surface (circuit-formed surface) 4a, a polyimide coating film 4g as a protective film is formed on the main surface 4a, as shown in FIG. 7. That is, since the polyimide coating film 4g is formed on the main surface 4a, even if the main surface 4a as the circuit-formed surface is chucked with a strong chucking force, it is possible to protect the circuits formed on the main surface 4a and it is possible to effect die bonding with a high positional accuracy. In other words, on the main surface 4a of the ASIC chip 4 is formed a polyimide coating film 4g for ensuring a high positional accuracy during die bonding.

In the case of the microcomputer chip 3 not required to have a high positional accuracy during die bonding, surface chucking with a collet (the clog-shaped collet 8) is not performed, therefore, such a protective film as the polyimide coating film 4g on the ASIC chip 4 is not formed on the main surface 3a of the semiconductor chip 3, as shown in FIG. 6.

FIGS. 6 and 7 illustrate electrode pads 3c and 4c formed on the microcomputer chip 3 and the ASIC chip 4, respectively, and surrounding structures. The microcomputer chip 3 shown in FIG. 6 is formed on its surface with only an insulating film 3d and a glass coating film 3e, while the ASIC chip 4 shown in FIG. 7 is formed on its surface with not only an insulating film 4d and a glass coating film 4e but also a polyimide coating film 4g as a protective film. According to this structure, the circuits formed on the main surface 4a are further protected by the polyimide coating film 4g. In both microcomputer chip 3 and ASIC chip 4, their electrode pads 3c and 4c are formed on titanium layers 3f and 4f, respectively.

The following description is now provided about another reason why the use of the round collet 9 is preferred in picking up the ASIC chip 4. In the SIP 1 of this embodiment, the first wires 6a, which are for coupling the microcomputer chip 3 as the first semiconductor chip with inner leads 2a electrically, include first wires 6a which jump over the ASIC chip 4 as the second semiconductor chip and which are then coupled to inner leads 2a, as indicated at portions M in FIGS. 4 and 5.

Therefore, the microcomputer chip 3 is formed thicker than the ASIC chip 4 lest the first wires 6a jumping over the ASIC chip 4 and the ASIC chip 4 should come into contact with each other. That is, since the ASIC chip 4 is thinner than the microcomputer chip 3, the first wires 6a jumping over the ASIC chip 4 can be prevented from contacting the ASIC chip 4.

Figure 16:
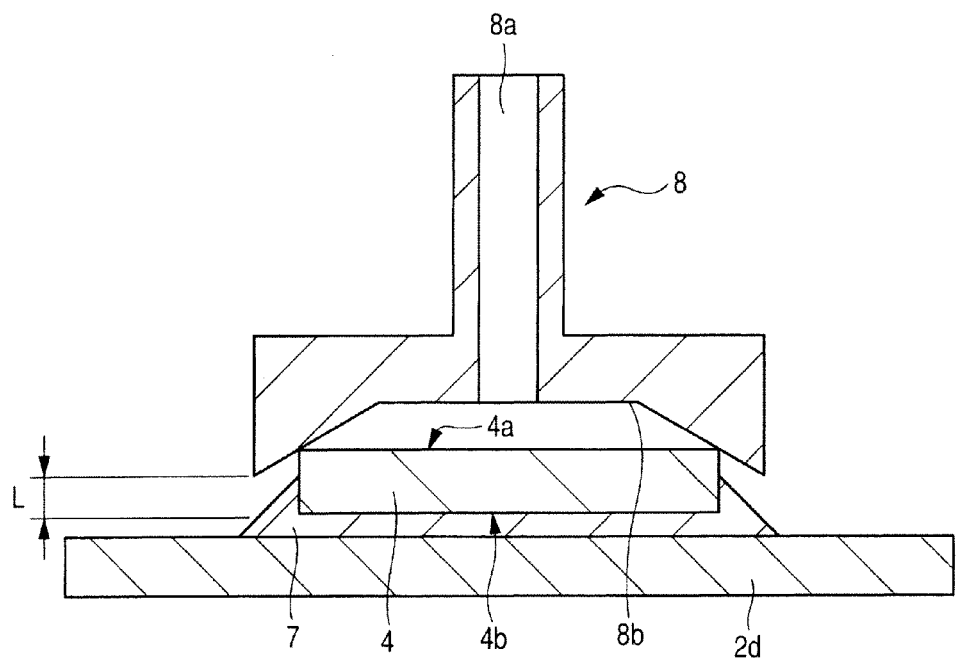
FIG. 16 is a sectional view showing a structural example in which the collet shown in FIG. 12 is used for a thin semiconductor chip.

Thus, the ASIC chip 4 is a thin semiconductor chip. If such a thin semiconductor chip is picked up using a collet of such a structure as the clog-shaped collet 8, as shown in FIG. 16, the paste material 7 for die bonding protruded from the back surface 4b of the ASIC chip 4 may adhere to the suction part 8b of the clog-shaped collet 8 and the paste material 7 thus adhered to the collet may further adhere to another semiconductor chip via the collet. That is, in the case of a thin semiconductor chip, the distance (L) shown in FIG. 16 becomes very short and there arises the problem that the paste material 7 adheres to the suction part 8b of the clog-shaped collet 8.

Figure 17:
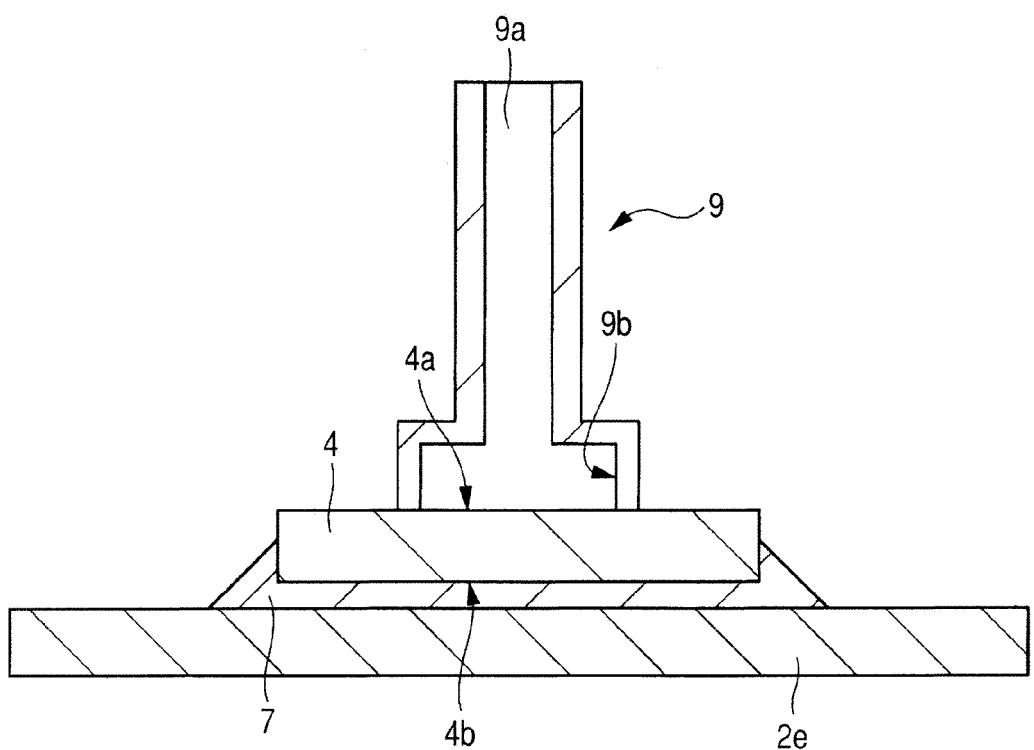
FIG. 17 is a sectional view showing a structural example in the second die bonding process using the collet shown in FIG. 14.

Therefore, when picking up the thin ASIC chip 4 in assembling the SIP 1, it is preferable to adopt such a round collet 9 as shown in FIG. 17.

Next, a method for manufacturing the semiconductor device (SIP 1) according to this embodiment will be described below with reference to a manufacturing flow chart of FIG. 8.

Figure 8:
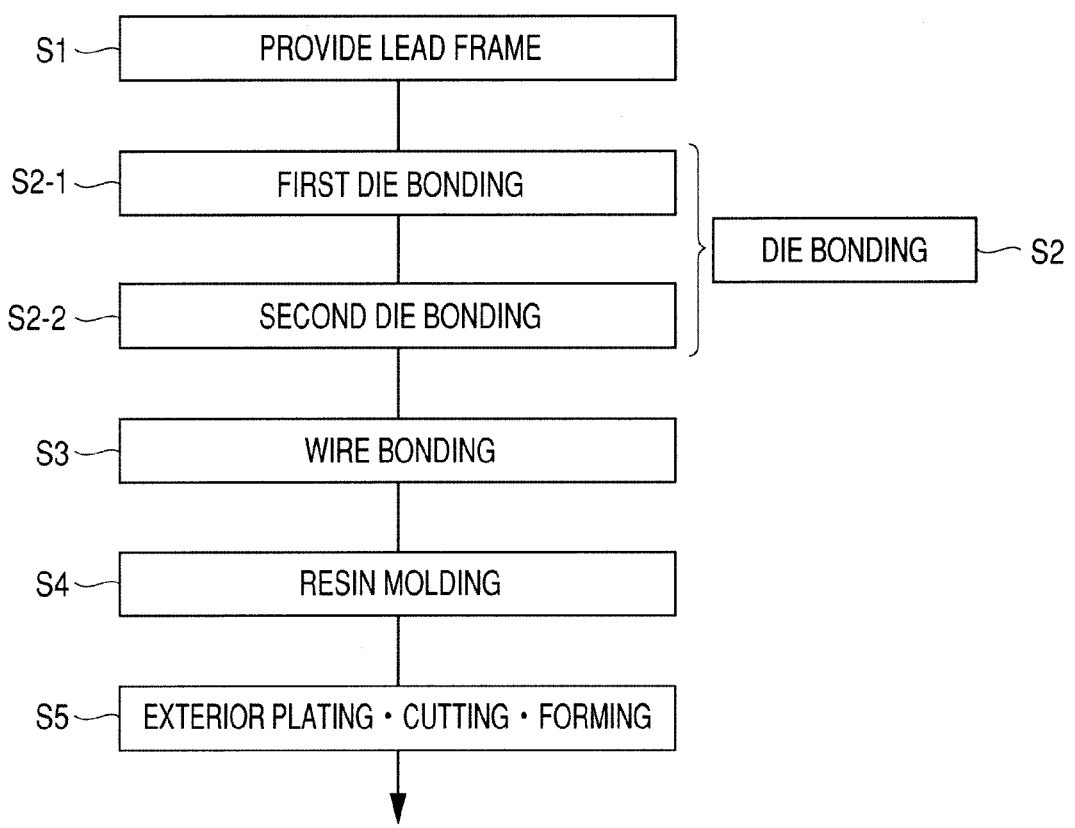
FIG. 8 is a manufacturing flow chart showing an example of an assembling procedure for the semiconductor device of FIG. 1.
Figure 10:
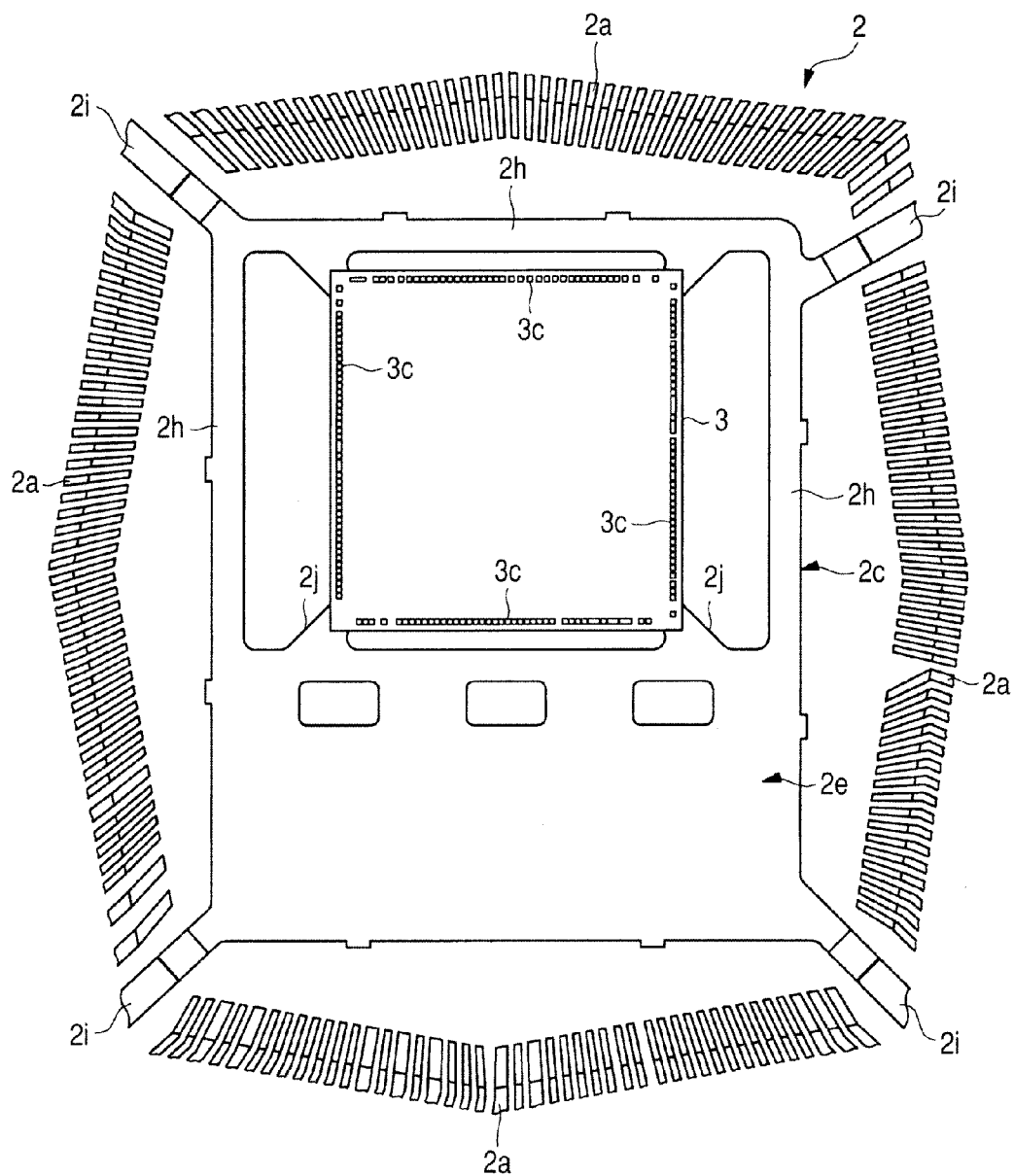
FIG. 10 is a partial plan view showing a structural example after first die bonding in assembling the semiconductor device of FIG. 1.
Figure 11:
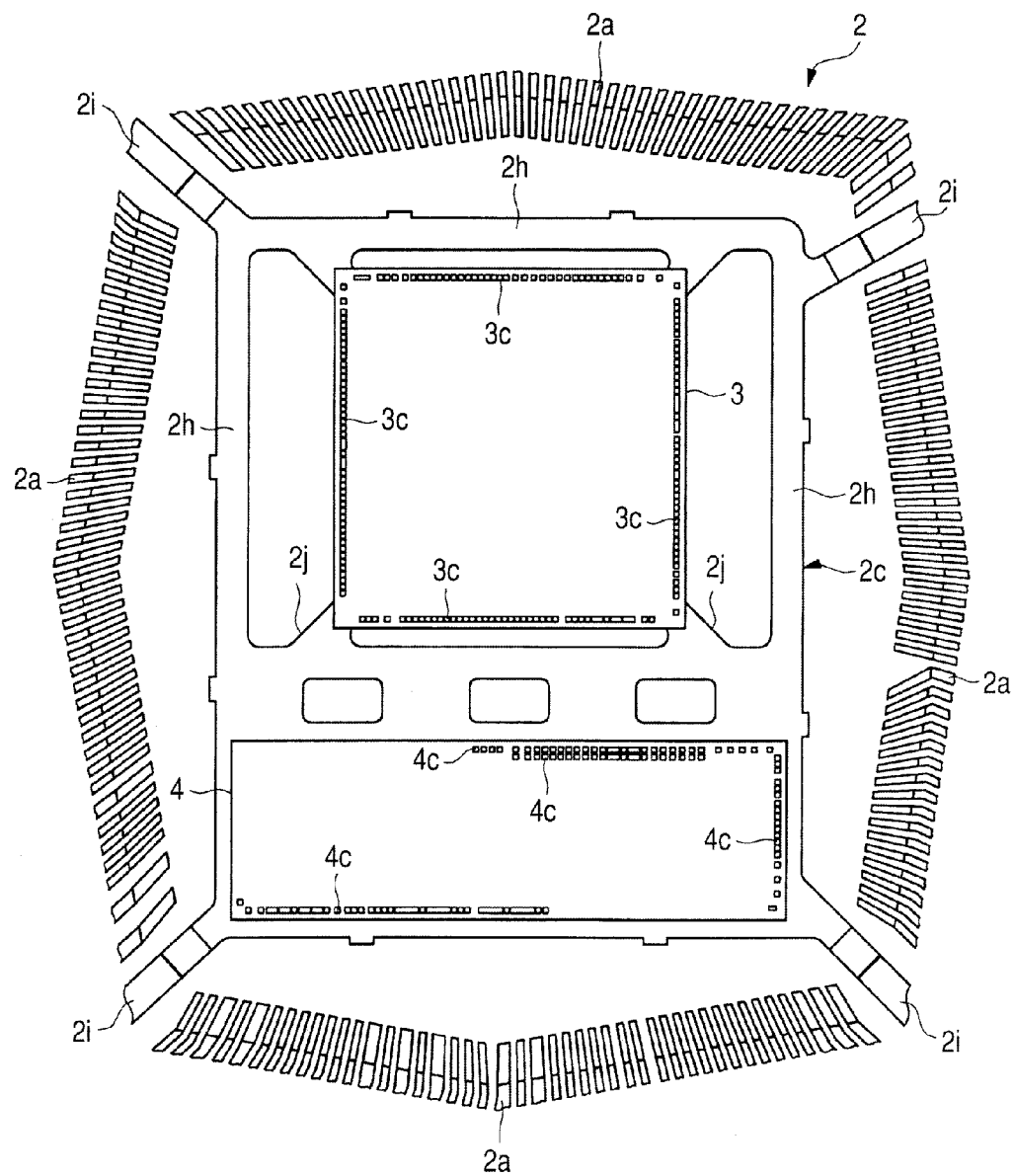
FIG. 11 is a partial plan view showing a structural example after second die bonding in assembling the semiconductor device of FIG. 1.
Figure 18:
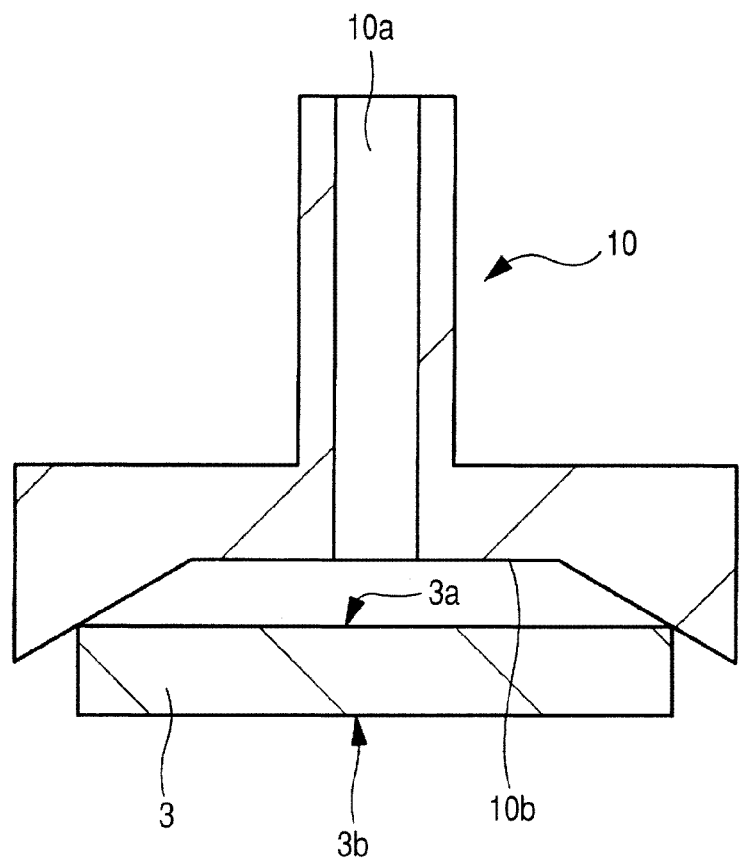
FIG. 18 is a sectional view showing a structural example in a chucking state of a modified pick-up collet used in the first die bonding process shown in FIG. 10.
Figure 19:
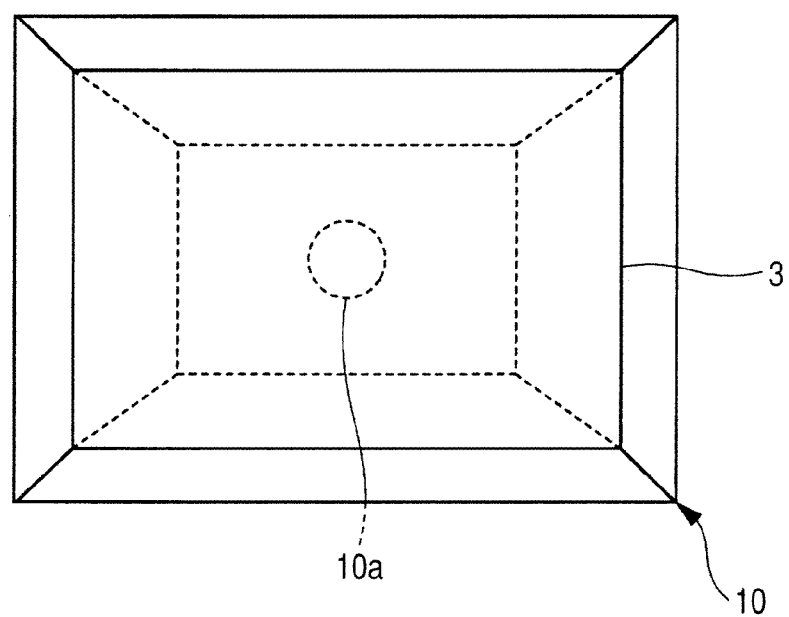
FIG. 19 is a back view thereof.
Figure 20:
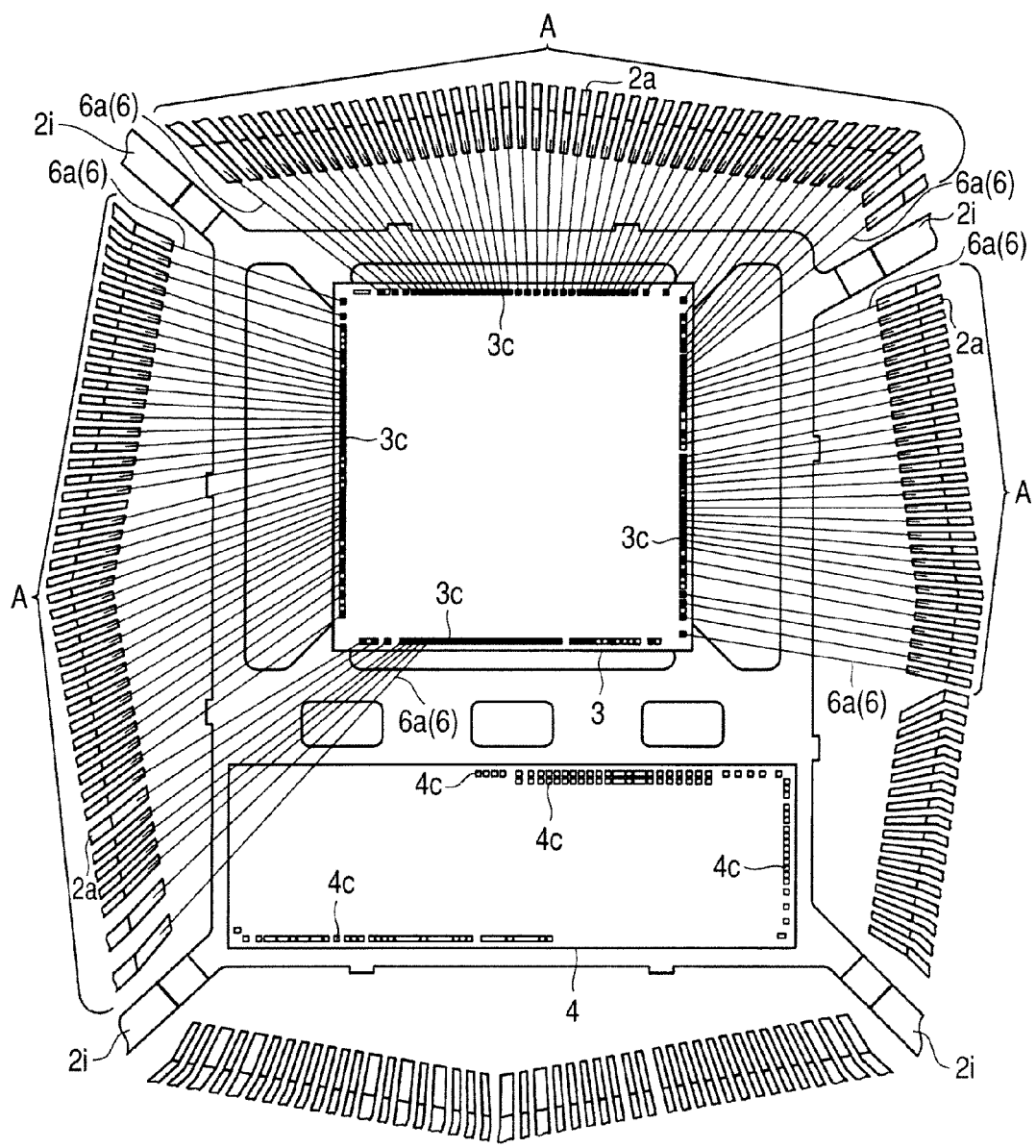
FIG. 20 is a partial plan view showing a structural example after wire bonding of the first semiconductor chip in assembling the semiconductor device of FIG. 1.
Figure 21:
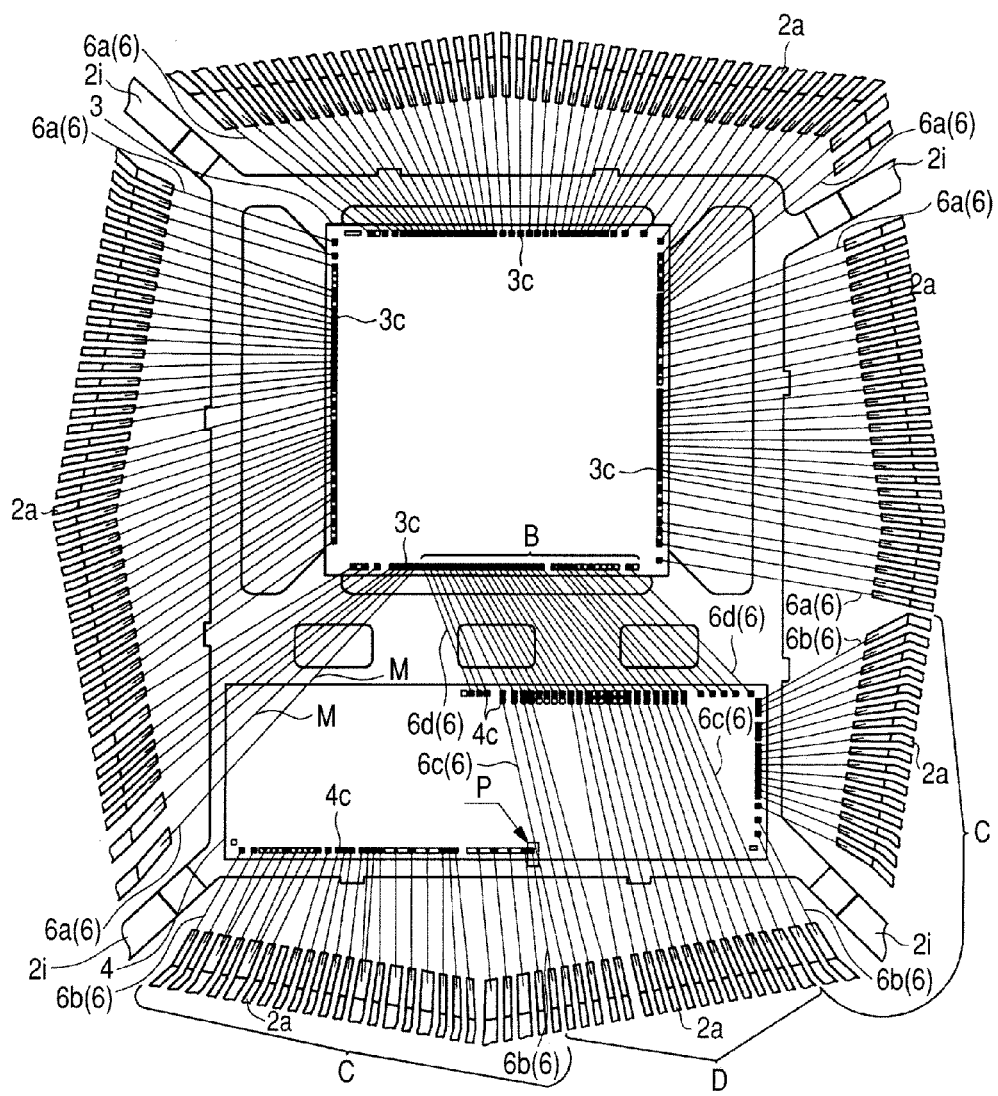
FIG. 21 is a partial plan view showing a structural example after wire bonding of the second semiconductor chip in assembling the semiconductor device of FIG. 1.
Figure 22:
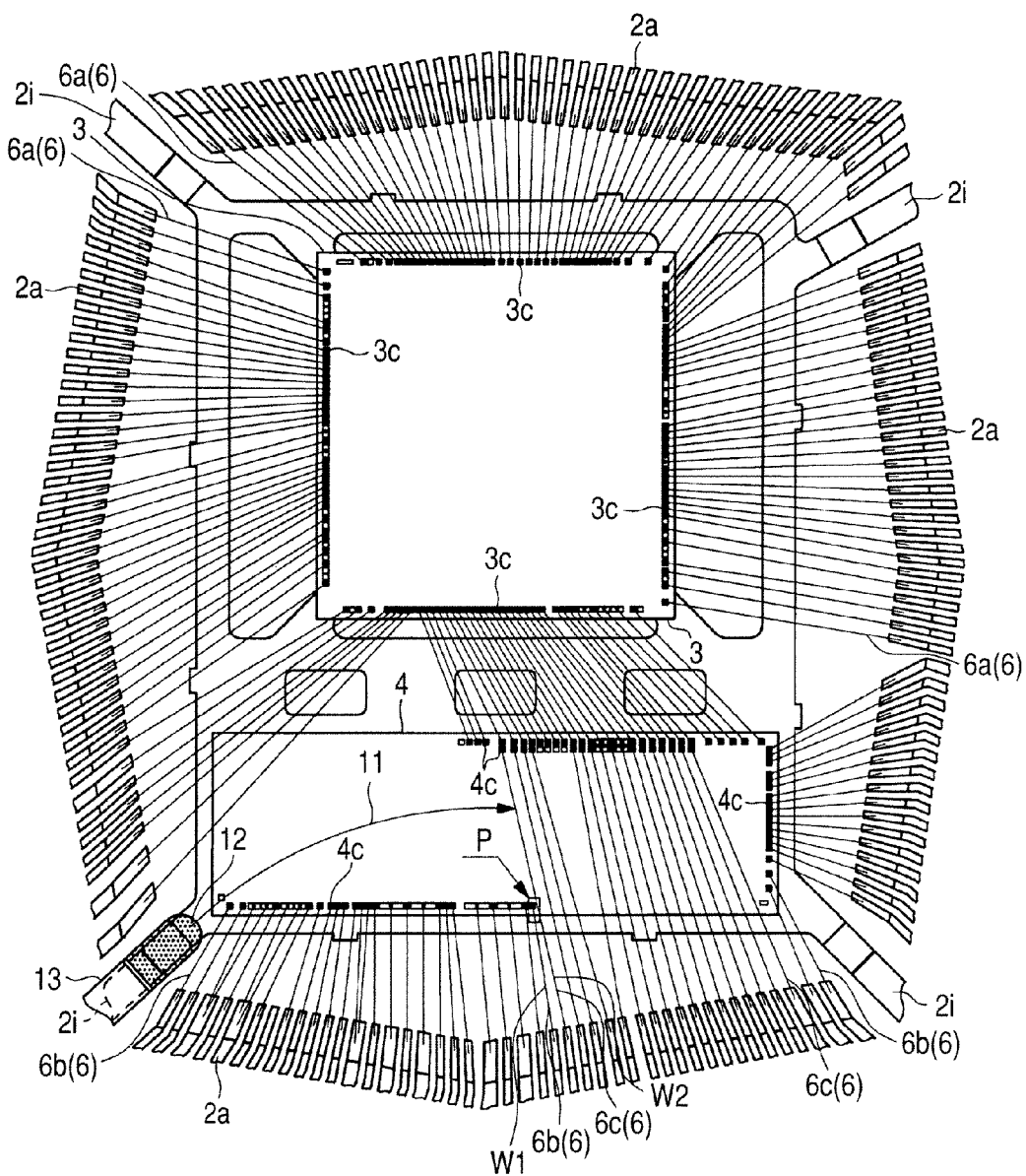
FIG. 22 is a partial plan view showing an example of a resin flowing direction during resin molding in assembling the semiconductor device of FIG. 1.
Figure 23:
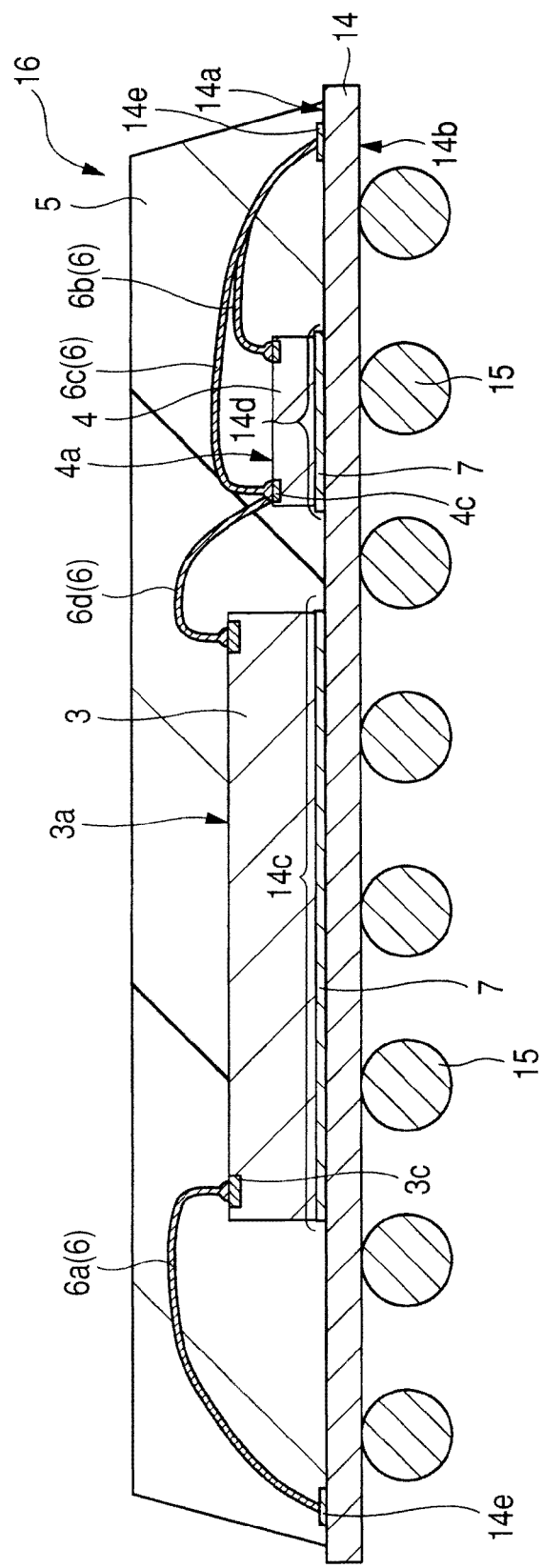
FIG. 23 is a sectional view showing the structure of a semiconductor device according to a modification of the embodiment of the present invention.

FIG. 8 is a manufacturing flow chart showing an example of an assembling procedure for the semiconductor device of FIG. 1, FIG. 9 is a partial plan view showing a structural example of die pads and the environs thereof of a lead frame used in assembling the semiconductor device of FIG. 1, FIG. 10 is a partial plan view showing a structural example after first die bonding in assembling the semiconductor device of FIG. 1, FIG. 11 is a partial plan view showing a structural example after second die bonding in assembling the semiconductor device of FIG. 1, FIG. 12 is a sectional view showing a structural example in a chucking state of a pick-up collet used in the first die bonding process shown in FIG. 10, FIG. 13 is a back view thereof, FIG. 14 is a sectional view showing a structural example in a chucking state of a pick-up collet used in the second die bonding process shown in FIG. 11, and FIG. 15 is a back view thereof. Further, FIG. 16 is a sectional view showing a structural example in which the collet shown in FIG. 12 is used for a thin semiconductor chip, FIG. 17 is a sectional view showing a structural example in the second die bonding process using the collet shown in FIG. 14, FIG. 18 is a sectional view showing a structural example in a chucking state of a modified pick-up collet used in the first die bonding process shown in FIG. 10, and FIG. 19 is a back view thereof. FIG. 20 is a partial plan view showing a structural example after wire bonding of the first semiconductor chip in assembling the semiconductor device of FIG. 1, FIG. 21 is a partial plan view showing a structural example after wire bonding of the second semiconductor chip in assembling the semiconductor device of FIG. 1, FIG. 22 is a partial plan view showing an example of a resin flowing direction during resin molding in assembling the semiconductor device of FIG. 1, and FIG. 23 is a sectional view showing the structure of a semiconductor device according to a modification of the embodiment of the present invention.

First, a lead frame is provided in step S1 shown in FIG. 8. More specifically, there is provided a lead frame 2 of FIG. 9, the lead frame 2 having a die pad 2c as a chip mounting portion and a plurality of inner leads 2a arranged around the die pad 2c, the die pad 2c including a first die pad 2d and a second die pad 2e which is disposed side by side with the first die pad 2d. The lead frame 2 is a thin plate member formed of copper alloy for example.

The die pad 2c, which is generally quadrangular, is supported at four corners thereof by four suspending leads 2i which are disposed on diagonal lines. Further, the die pad 2c is provided in the inside thereof with an area of the first die pad 2d and an area of the second die pad 2e, having a shape such that the area of the first die pad 2d surrounded by frame portions 2h and the area of the second die pad 2e which is generally rectangular are bonded together. The first die pad 2d is supported by four supporting leads 2j extending inwards from the frame portions 2h and it has a small tab structure.

Thereafter, die bonding of step S2 in FIG. 8 is performed. First, a first die bonding of step S2-1 is performed. In this first die bonding step, as shown in FIG. 10, a microcomputer chip 3 is mounted onto the first die pad 2d in the die pad 2c of the lead frame 2. More particularly, in the SIP 1 of this embodiment, both the microcomputer chip 3 for which a high positional accuracy is not required and the ASIC chip 4 for which a high positional accuracy is required are mounted. In assembling the SIP 1, therefore, die bonding starts with the microcomputer chip 3 not required to have a high positional accuracy as the first die bonding, then, as the second die bonding, the ASIC chip 4 required to have a high positional accuracy is subjected to die bonding.

This is for the following reason. Conveyance of the lead frame 2 is performed at the time of transfer from the first to the second die bonding step, so first the microcomputer chip 3 not required to have a high positional accuracy is mounted and thereafter the ASIC chip 4 required to have a high positional accuracy is mounted, whereby it becomes possible to further enhance the positional accuracy of the ASIC chip 4 which is later mounted.

First, a paste material 7 as a die bonding material is applied to an upper surface 2f of the first die pad 2d shown in FIG. 3. Then, the microcomputer chip 3 is picked up with the clog-shaped collet 8 which is a surface non-contact type collet, as shown in FIG. 12. Further, the microcomputer chip 3 thus picked up is bonded onto the first die pad 2d through the paste material 7.

In the pick-up operation, a pick-up unit detects a circuit pattern of the microcomputer chip 3 and calculates a chip center, then picks up the center of the microcomputer chip 3. While maintaining this state, the microcomputer chip 3 is mounted on the center of the first die pad 2d, as shown in FIG. 10.

As shown in FIG. 5, since concave stepped cut portions 3g are formed in edge portions of the main surface 3a of the microcomputer chip 3, it is possible to diminish contact with the suction part 8b of the clog-shaped collet 8. As a result, not only the amount of aluminum scrap produced from the microcomputer chip 3 can be decreased, but also it is possible to suppress a lowering of the chucking force of the clog-shaped collet 8 caused by generation of dust particles.

Now, the first die bonding operation for the microcomputer chip 3 is completed.

Then, conveyance of the lead frame 2 is performed, and thereafter the second die bonding step S2-2 shown in FIG. 8 is carried out.

First, the paste material 7 as a die bonding material is applied to the upper surface 2g of the second die pad 2e shown in FIG. 3. Then, as shown in FIG. 14, the ASIC chip 4 is picked up with the round collet 9 which is a surface contact type collet and the ASIC chip 4 thus picked up is bonded onto the second die pad 2e through the paste material 7.

In the pick-up operation, as is the case with the microcomputer chip 3, the pick-up unit detects a circuit pattern of the ASIC chip 4 and calculates a center of the ASIC chip 4, then picks up the center of the chip 4. While maintaining this state, the ASIC chip 4 is mounted on the center of the second die pad 2e, as shown in FIG. 11.

In the case of the ASIC chip 4, since the suction part 9b of the round collet 9 comes into contact with the main surface (circuit-formed surface) 4a, a polyimide coating film 4g is formed on the main surface 4a, as shown in FIG. 7. Thus, since the polyimide coating film 4g is formed on the main surface 4a, not only the circuits formed on the main surface 4a can be protected even when the circuit-formed surface (main surface 4a) is chucked with a strong chucking force of the round collet 9, but also it is possible to effect die bonding while ensuring a high positional accuracy.

The second bonding step for the ASIC chip 4 is now completed.

Thereafter, the paste material 7 bonded to the microcomputer chip 3 on the first die pad 2d shown in FIG. 3 and the paste material 7 bonded to the ASIC chip 4 on the second die pad 2e are heat-cured at a time. More specifically, in each of the first and second die bonding steps, the microcomputer chip 3 and the ASIC chip 4 are each fixed to a temporary degree, then after completion of both die bonding steps, both paste materials 7 are heat-cured at a time.

By thus heat-curing the paste material 7 for the microcomputer 3 and the paste material 7 for the ASIC chip 4 at a time it is possible to improve productivity in assembling the SIP 1.

That is, by first die-bonding the microcomputer chip 3 not required to have a high positional accuracy and subsequently die-bonding the ASIC chip 4 required to have a high positional accuracy, both past materials 7 can be heat-cured at a time, with the result that the productivity of the SIP 1 can be improved.

Thereafter, wire bonding of step S3 in FIG. 8 is performed. More specifically, wire bonding is performed for each of the microcomputer chip 3 and the ASIC chip 4. Here, a description will be given below about the case where wire bonding starts with the microcomputer chip 3 which is the first semiconductor chip.

First, as shown in FIG. 20, first wires for coupling to the microcomputer chip 3 as the first semiconductor chip are bonded. In this case, in the area indicated at A in FIG. 20, first wires 6a are first coupled electrically between the microcomputer chip 3 and inner leads 2a.

Among the first wires 6a are included wires which are coupled to inner leads 2a beyond the ASIC chip 4, as indicated at M in FIG. 21. Therefore, the ASIC chip 4 is formed thinner than the microcomputer chip 3. Since the ASIC chip 4 is thinner than the microcomputer chip 3, even if the first wires 6a jumping over the ASIC chip 4 are present, it is possible to prevent contact between the first wires 6a and the ASIC chip 4.

Thereafter, in the area indicated at B in FIG. 21, fourth wires 6d for electrical coupling between the microcomputer chip 3 and the ASIC chip 4 are bonded. That is, chip-to-chip wires (fourth wires 6d) are bonded between the microcomputer chip 3 and the ASIC chip.

Then, in the areas indicated at C in FIG. 21, second wires 6b for electrical coupling between the ASIC chip 4 and inner leads 2a are bonded. Further, in the area indicated at D in FIG. 21, third wires 6c for electrical coupling between the ASIC chip 4 and inner leads 2a are bonded. Since the third wires 6c jump over the main surface 4a from a marginal portion of the main surface 4a and are bonded to inner leads 2a located on the opposite side, the third wires 6c are higher in wire loop and larger in wire length than the second wires 6b.

Consequently, in the SIP 1 of this embodiment, such a spacing as indicated by the distance (K) in FIG. 3 can be provided between adjacent second wire 6b and third wire 6c located close to each other in portion P shown in each of FIGS. 4 and 21 (the value of K is, for example, about 80-odd to 90-odd μm). In the SIP 1, by adopting the round collet 9 in the die bonding operation for the ASIC chip 4, it is possible to enhance the positional accuracy in die bonding. As a result, since the ASIC chip 4 is die-bonded with a high positional accuracy, a desired spacing (K) can be provided between the adjacent second wire 6b and third wire 6c located close to each other.

In the ASIC chip 4 shown in FIG. 21, electrode pads 4c cannot be disposed continuously with the pad row (a marginal portion on the right-hand side of portion P in FIG. 21) including an electrode pad 4c located in portion P at a marginal portion of the main surface 4a, but a plurality of electrode pads 4c coupled to third wires 6c are arranged on the opposite-side marginal portion. This is because there is formed an intra-chip circuit which separates both pad rows (the pad row of electrode pads 4c coupled to second wires 6b and the pad row of electrode pads 4c coupled to third wires 6c) from each other.

Thus, in the SIP 1, not only there exist wires 6 which are compelled to jump over the main surface 4a and be coupled to inner leads 2a on the opposite side, like third wires 6c, but also it is necessary that the ASIC chip 4 be die-bonded with a high positional accuracy also from the standpoint of preventing contact between second and third wires 6b, 6c in portion P. The adoption of the round collet 9 is very effective in die bonding.

As to in what order the first, second, third and fourth wires 6a, 6b, 6c, 6d are to be subjected to wire bonding, no limitation is made to the above order. The wire bonding order may be an arbitrary order. However, as to wires which are likely to cross or approach each other at a horizontal position, the wiring is performed with a difference in height, and in this case the wires lower in wire loop height are the first to be subjected to wire bonding.

After completion of the wire bonding operation, resin molding of step S4 in FIG. 8 is performed. In this step, resin molding is performed to seal the microcomputer chip 3, ASIC chip 4, wires 6 and inner leads 2a with resin. In this resin molding step, as indicated at a resin flowing direction 11 in FIG. 22, a molding gate 13 is disposed at a position corresponding to the suspending lead 2i located on the second wire 6b (W1) side in portion P where the second and third wires 6b (W1), 6c (W2) are close to each other and sealing resin 12 is poured from the molding gate 13 so as to push the third wire 6c (W2) in a direction away from the second wire 6b (W1) which is lower in wire loop than the third wire 6c (W2).

That is, in the resin molding step for the SIP 1 according to this embodiment, the molding gate 13 is provided in such a manner that the sealing resin 12 flows so as to push the wire 6 high in wire loop (large in wire length) in a direction away from the wire 6 low in wire loop (small in wire length).

Consequently, the third wire 6c high in wire loop is pushed by the sealing resin 12, producing a wire flow, and hence it is possible to prevent shorting, or contact, between both third and second wires 6c, 6b.

Moreover, since the third wire 6c longer than the second wire 6b is pushed away from the second wire 6b by the sealing resin 12, the spacing from the second wire 6b becomes wider, whereby it is possible to make wire shorting more difficult to occur.

After completion of pouring of the sealing resin 12, there is formed a sealing body 5 by curing the sealing resin 12.

In the SIP 1 of this embodiment, since the microcomputer chip 3 is mounted on the first die pad 2d of a small tab structure, it is possible to increase the area of contact between the microcomputer chip 3 and the sealing resin 12. As a result, it is possible to enhance the bonding force between the two and thereby suppress the occurrence of a package crack and improve the reliability of the SIP 1.

After completion of resin molding there are performed exterior plating, cutting and forming in step S5 shown in FIG. 8. Exterior plating is performed for the outer leads 2b of the lead frame 2 formed with the sealing body 5, then the outer leads 2b are cut at respective end portions and bent in a gull wing shape as in FIG. 2 to complete assembly of the SIP 1.

In the method for manufacturing the semiconductor device (SIP 1) according to this embodiment, two types of collets, i.e., the clog-shaped collet 8 and the round collet 9, are used properly in the die bonding step in assembling the SIP 1, whereby a high positional accuracy of one semiconductor chip (ASIC chip 4) which has been die-bonded using the round collet 9 is attained and it is possible to stabilize the quality of the SIP 1.

Moreover, in die bonding, the two types of collets are used properly for the ASIC chip 4 required to have a high positional accuracy and for the microcomputer chip 3 not required to have a high positional accuracy, and the paste materials 7 for the two semiconductor chips are heat-cured at a time after completion of the second die bonding, whereby it is possible to improve the productivity while keeping cost-up of the SIP 1 to a minimum.

That is, although the cost increases slightly, since it becomes possible to stabilize the positional accuracy of each semiconductor chip, it is possible to simplify inspection (e.g., visual inspection for the paste materials 7 in the die bonding step) and improve the yield of the SIP 1; besides, it is also possible to maintain the high quality of the SIP 1.

Next, the following description is provided about a modification of this embodiment. FIGS. 18 and 19 illustrate a collet according to the modification. A pyramidal collet 10 is shown therein as a modified example of the surface non-contact type collet. In the die bonding process during assembly of the SIP 1, the pyramidal collet 10, like the clog-shaped collet 8, has a suction part 10b, which sucks air through a suction hole 10a to chuck and pick up a semiconductor chip (e.g., the microcomputer chip 3) not required to have a high positional accuracy. In this state the semiconductor chip is subjected to die bonding. In assembling the SIP 1 of this embodiment, the pyramidal collet 10 is used in the first die bonding step.

Over the main surface of a quadrangular semiconductor chip the pyramidal collet 10 holds the semiconductor chip so that its slant faces come into contact with two opposed sides of the chip main surface.

In assembling the SIP 1, by using the pyramidal collet 10 in the first die bonding step for the microcomputer chip 3 for which a high positional accuracy is not required, it is possible to obtain the same effect as in the use of the clog-shaped collet 8.

Next, a modification shown in FIG. 23 is of the case where the semiconductor device is a BGA (Ball Grid Array) type SIP 16.

The BGA type SIP 16 includes a wiring substrate 14, the wiring substrate 14 having an upper surface 14a for mounting thereon of a semiconductor chip, a lower surface 14b located on the side opposite to the upper surface, a first chip mounting area (a first chip mounting portion) 14c, a second chip mounting area (a second chip mounting portion) 14d, and a plurality of bonding leads 14e, the first and second chip mounting areas 14c, 14d and the bonding leads 14e being formed on the upper surface 14a. The SIP 16 further includes a microcomputer chip 3, an ASIC chip 4, the chips 3 and 4 being mounted on the upper surface 14a of the wiring substrate 14, and a plurality of solder balls 15 provided on the lower surface 14b of the wiring substrate 14.

On the upper surface 14a of the wiring substrate 14 the first and second chip mounting areas 14c, 14d are formed side by side and the bonding leads 14e are formed around those chip mounting areas. The microcomputer chip 3 is mounted in the first chip mounting area 14c on the upper surface 14a of the wiring substrate 14 through the paste material 7, while the ASIC chip 4 is mounted in the second chip mounting area 14d on the upper surface 14a of the wiring substrate 14 through the paste material 7.

Both microcomputer chip 3 and ASIC chip 4 are mounted by face-up bonding to the upper surface 14a of the wiring substrate 14 and are each coupled electrically to the bonding leads 14e of the wiring substrate 14 through a plurality of wires 6. More specifically, the electrode pads 3c formed on the main surface 3a of the microcomputer chip 3 face-up-mounted on the wiring substrate 14 and the bonding leads 14e of the wiring substrate 14 are coupled together electrically through wires 6. Likewise, the electrode pads 4c formed on the main surface 4a of the ASIC chip 4 face-up-mounted on the wiring substrate 14 and the bonding leads 14e of the wiring substrate 14 are coupled together electrically through wires 6.

Moreover, like the SIP 1, the microcomputer chip 3 and the ASIC chip 4 are also coupled together electrically through wires 6.

Further, the microcomputer chip 3, the ASIC chip 4 and the wires 6 are resin-sealed by the sealing body 5 on the upper surface 14a of the wiring substrate 14.

The solder balls 15 provided on the lower surface 14b of the wiring substrate 14 are external coupling terminals of the SIP 16.

Also in the case of such a BGA type SIP 16, in the die bonding process during assembly thereof, the microcomputer chip 3 not required to have a high positional accuracy is picked up by the clog-shaped collet (surface non-contact type collet) 8 and is die-bonded onto the wiring substrate 14, thereafter, the ASIC chip 4 required to have a high positional accuracy is picked up by the round collet (surface contact type collet) 9 and is die-bonded onto the wiring substrate 14, whereby it is possible to obtain the same effect as in the case of the SIP 1.

Thus, also in the case of the BGA type SIP 16, by properly using two types of collets, i.e., the clog-shaped collet 8 and the round collet 9, in the die bonding process during assembly of the SIP 16, not only there is attained a high positional accuracy of one ASIC chip 4 which has been die-bonded by the round collet 9, but also it is possible to stabilize the quality of the SIP 16.

Further, by using the two types of collets properly for the ASIC chip required to have a high positional accuracy and for the microcomputer chip 3 not required to have a high positional accuracy, in the die bonding process, and by heat-curing the paste materials 7 for the two semiconductor chips at a time after completion of the second die bonding, it is possible to attain the improvement of productivity while keeping cost-up of the SIP 16 to a minimum.

As to another manufacturing method for the SIP 16 and another effect obtained by the method, they are the same as in the case of the SIP 1 manufacturing method and therefore repeated explanations thereof will here be omitted.

Although the present invention has been described above concretely by way of embodiments thereof, it goes without saying that the present invention is not limited to the above embodiments, but that various changes may be made within the scope not departing from the gist of the invention.

For example, although in the above embodiments a description has been given about the case where two semiconductor chips, i.e., the microcomputer chip 3 and the ASIC chip 4, are mounted on the semiconductor device, the semiconductor device may have three or more semiconductor chips mounted thereon insofar as these semiconductor chips are die-bonded by properly using two types of collets, i.e., a surface contact type collet and a surface non-contact type collet.

The present invention is suitable for assembling an electronic device which is assembled through die bonding.

What is claimed is:

1. A method for manufacturing a semiconductor device, comprising the steps of:
    (a) providing a lead frame, the lead frame having a chip mounting portion and a plurality of leads arranged around the chip mounting portion, the chip mounting portion including a first chip mounting portion and a second chip mounting portion disposed side by side with the first chip mounting portion;
    (b) picking up a first semiconductor chip with a surface non-contact type collet and die-bonding the picked-up first semiconductor chip over the first chip mounting portion, wherein the first semiconductor chip is mounted over the first chip mounting portion through a paste material;
    (c) after the step (b), picking up a second semiconductor chip with a surface contact type collet and die-bonding the picked-up second semiconductor chip over the second chip mounting portion, the second semiconductor chip is mounted over the second chip mounting portion through a paste material; and
    (d) after the step (c), wire-bonding each of the first and second semiconductor chips, wherein after the step (c) and before the step (d) the paste material over the first chip mounting portion and the paste material over the second chip mounting portion are heat-cured at a time.

2. A method according to claim 1, wherein the second semiconductor chip has a protective film over a circuit-formed surface thereof.

3. A method according to claim 2, wherein the second semiconductor chip has a logic circuit.

4. A method according to claim 1, wherein the first semiconductor chip has stepped concave portions in edges of a circuit-formed surface thereof.

5. A method according to claim 4, wherein the first semiconductor chip is a microcomputer chip.

6. A method according to claim 1,
    wherein in the step (d) first wires are bonded to the first semiconductor chip, while second wires and third wires larger in loop height than the second wires are bonded to the second semiconductor chip,
    wherein the step (d) is followed by a step (e) of sealing the first and second semiconductor chips with sealing resin by resin molding,
    wherein in the step (e) the sealing resin is poured so as to push the third wires in a direction away from the second wires.

7. A method according to claim 1, wherein in the step (d) first wires are bonded to the first semiconductor chip, while second wires and third wires larger in loop height than the second wires are bonded to the second semiconductor chip, the first wires including wires which jump over the second semiconductor chip and are coupled to the leads.

8. A method according to claim 7, wherein the thickness of the second semiconductor chip is smaller than that of the first semiconductor chip.

9. A method according to claim 1,
    wherein in the step (d) first wires are bonded to the first semiconductor chip, while second wires and third wires larger in loop height than the second wires are bonded to the second semiconductor chip, and fourth wires are bonded to both the first and the second semiconductor chip.

10. A method for manufacturing a semiconductor device, comprising the steps of:
    (a) providing a wiring substrate, the wiring substrate having a chip mounting portion and a plurality of bonding leads arranged around the chip mounting portion, the chip mounting portion including a first chip mounting portion and a second chip mounting portion disposed side by side with the first chip mounting portion;
    (b) picking up a first semiconductor chip with a surface non-contact type collet and die-bonding the picked-up first semiconductor chip over the first chip mounting portion, wherein the first semiconductor chip is mounted over the first chip mounting portion through a paste material;
    (c) after the step (b), picking up a second semiconductor chip with a surface contact type collet and die-bonding the picked-up second semiconductor chip over the second chip mounting portion, wherein the second semiconductor chip is mounted over the second chip mounting portion through a paste material; and
    (d) after the step (c), wire-bonding each of the first and second semiconductor chips, wherein after the step (c) and before the step (d) the paste material over the first chip mounting portion and the paste material over the second chip mounting portion are heat-cured at a time.

11. A method according to claim 10, wherein the second semiconductor chip has a protective film over a circuit-formed surface thereof.

12. A method according to claim 11, wherein the second semiconductor chip has a logic circuit.

* * * * *